(12) United States Patent
Ippolito et al.

(10) Patent No.: US 9,231,597 B2
(45) Date of Patent: Jan. 5, 2016

(54) DIGITALLY CONTROLLED OSCILLATOR CALIBRATION CIRCUIT AND METHOD

(71) Applicant: STMicroelectronics S.r.l., Agrate Brianza (IT)

(72) Inventors: Calogero Marco Ippolito, Aci Castello (IT); Mario Chiricosta, Tremestieri Etneo (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 14/261,283

(22) Filed: Apr. 24, 2014

(65) Prior Publication Data

US 2014/0320218 A1    Oct. 30, 2014

(30) Foreign Application Priority Data

Apr. 29, 2013 (IT) .............................. TO2013A0347

(51) Int. Cl.
*H03L 7/00*     (2006.01)
*H03L 7/089*    (2006.01)

(52) U.S. Cl.
CPC . *H03L 7/00* (2013.01); *H03L 7/089* (2013.01)

(58) Field of Classification Search
CPC .................................. H03L 7/00; H03L 7/089
USPC ........ 331/1 R, 11, 12, 16, 17, 25, 34, DIG. 2; 327/159; 375/376
See application file for complete search history.

(56) References Cited

U.S. PATENT DOCUMENTS

| 5,592,110 A | 1/1997 | Noguchi |
| 6,005,425 A * | 12/1999 | Cho ............................... 327/156 |
| 6,778,024 B2 | 8/2004 | Gupta et al. |
| 7,099,643 B2 | 8/2006 | Lin |

(Continued)

FOREIGN PATENT DOCUMENTS

| EP | 0 689 315 A1 | 12/1995 |
| EP | 1 211 811 A1 | 6/2002 |
| FR | 2 703 534 A1 | 10/1994 |

OTHER PUBLICATIONS

Lee et al., "A Σ-42 Fractional-N Frequency Synthesizer Using a Wide-Band Integrated VCO and a Fast AFC Technique for GSM/GPRS/WCDMA Applications," *IEEE Journal of Solid-State Circuits* 39(7):1164-1169, Jul. 2004.

(Continued)

*Primary Examiner* — Richard Tan
(74) *Attorney, Agent, or Firm* — Seed IP Law Group PLLC

(57) ABSTRACT

A calibration circuit for a DCO includes a signal-conditioning module configured for (i) receiving at input an oscillating signal generated by the DCO and a reference signal, both designed to oscillate between a high logic value ("1") and a low logic value ("0"), and (ii) detecting a respective first and second stable logic value of the reference signal and of the oscillating signal; and a period-to-voltage converter module coupled to the signal-conditioning module and configured for (iii) generating a difference signal identifying a difference between the period of the reference signal and the period of the oscillating signal, and (iv) controlling, on the basis of the difference signal, the DCO so as to conform the duration of the period of the oscillating signal to the duration of the period of the reference signal. Likewise described is a calibration method implemented by the calibration circuit.

25 Claims, 10 Drawing Sheets

(56) References Cited

U.S. PATENT DOCUMENTS

| | | | |
|---|---|---|---|
| 2002/0031193 | A1 | 3/2002 | Harrison |
| 2005/0226357 | A1* | 10/2005 | Yoshimura ................ 375/376 |
| 2008/0231324 | A1* | 9/2008 | Liu et al. ...................... 327/12 |
| 2010/0102894 | A1 | 4/2010 | Sun et al. |
| 2014/0177771 | A1* | 6/2014 | Maruko et al. ............. 375/375 |

OTHER PUBLICATIONS

Lin et al., "A 900-MHz 2.5-mA CMOS Frequency Synthesizer with an Automatic SC Tuning Loop," *IEEE Journal of Solid-State Circuits* 36(3):424-431, Mar. 2001.

Aktas et al., "CMOS PLL Calibration Techniques," *IEEE Circuits &Devices Magazine* 20(5):6-11, Sep. 2004.

Lee et al., "A 480-MHz to 1-GHz Sub-picosecond Clock Generator with a Fast and Accurate Automatic Frequency Calibration in 0.13-μm CMOS," IEEE Asian Solid-State Circuits Conference, Jeju, Korea, Nov. 12-14, 2007, pp. 67-70.

Lin et al., "A 900MHz, 2.5mA CMOS Frequency Synthesizer with an Automatic SC Tuning Loop," IEEE Custom Integrated Circuits Conference, Orlando, FL, May 21-24, 2000, 4 pages.

Lin et al., "An Agile VCO Frequency Calibration Technique for a 10-GHz CMOS PLL," *IEEE Journal of Solid-State Circuits* 42(2):340-349, Feb. 2007.

Marutani et al., "An 18mW 90 to 770MHz Synthesizer with Agile Auto-Tuning for Digital TV-Tuners," IEEE International Solid-State Circuits Conference, San Francisco, CA, 2006, 10 pages.

Wilson et al, "A CMOS Self-Calibrating Frequency Synthesizer," *IEEE Journal of Solid-State Circuits* 35(10):1437-1444, Oct. 2000.

* cited by examiner

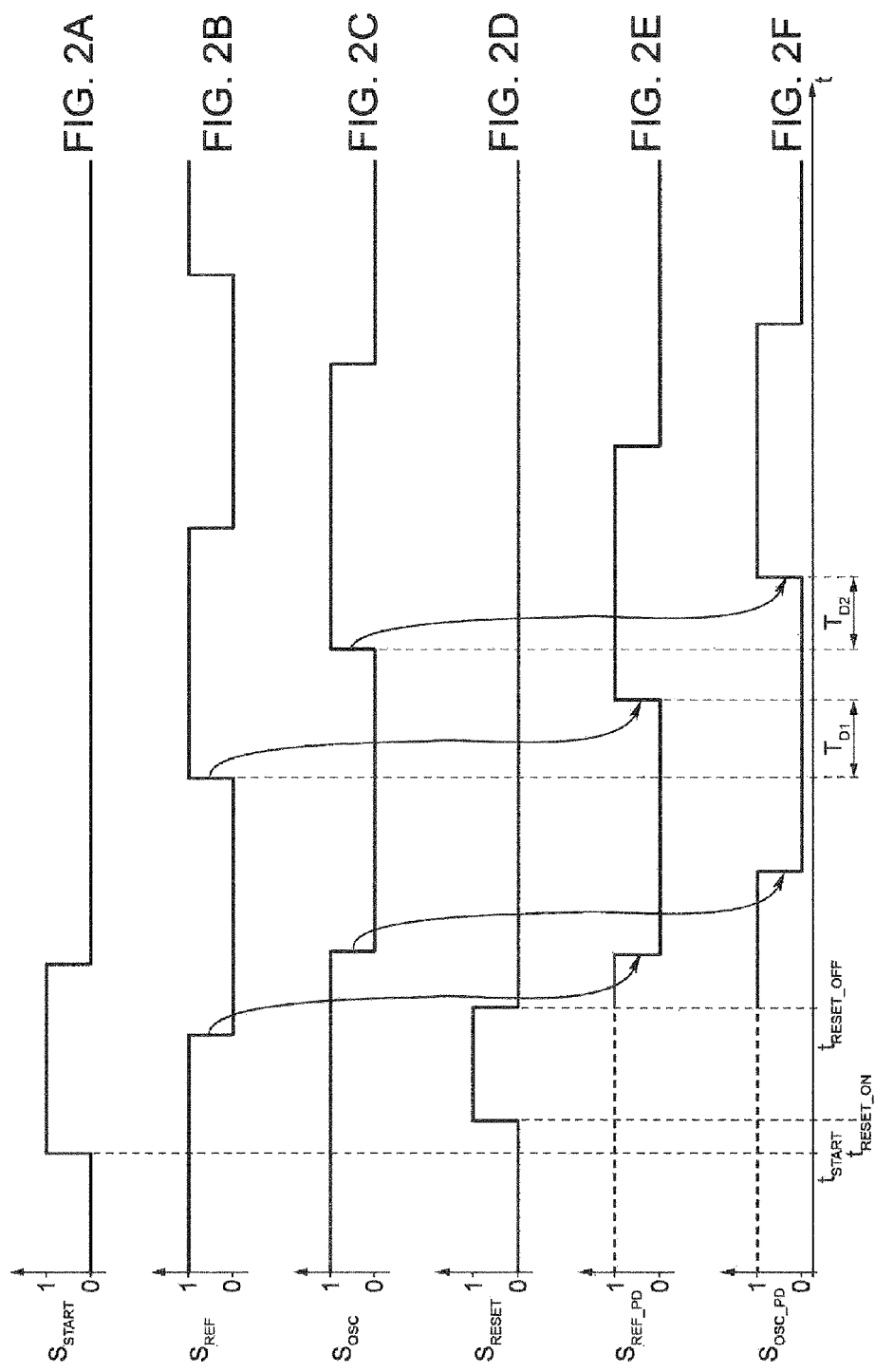

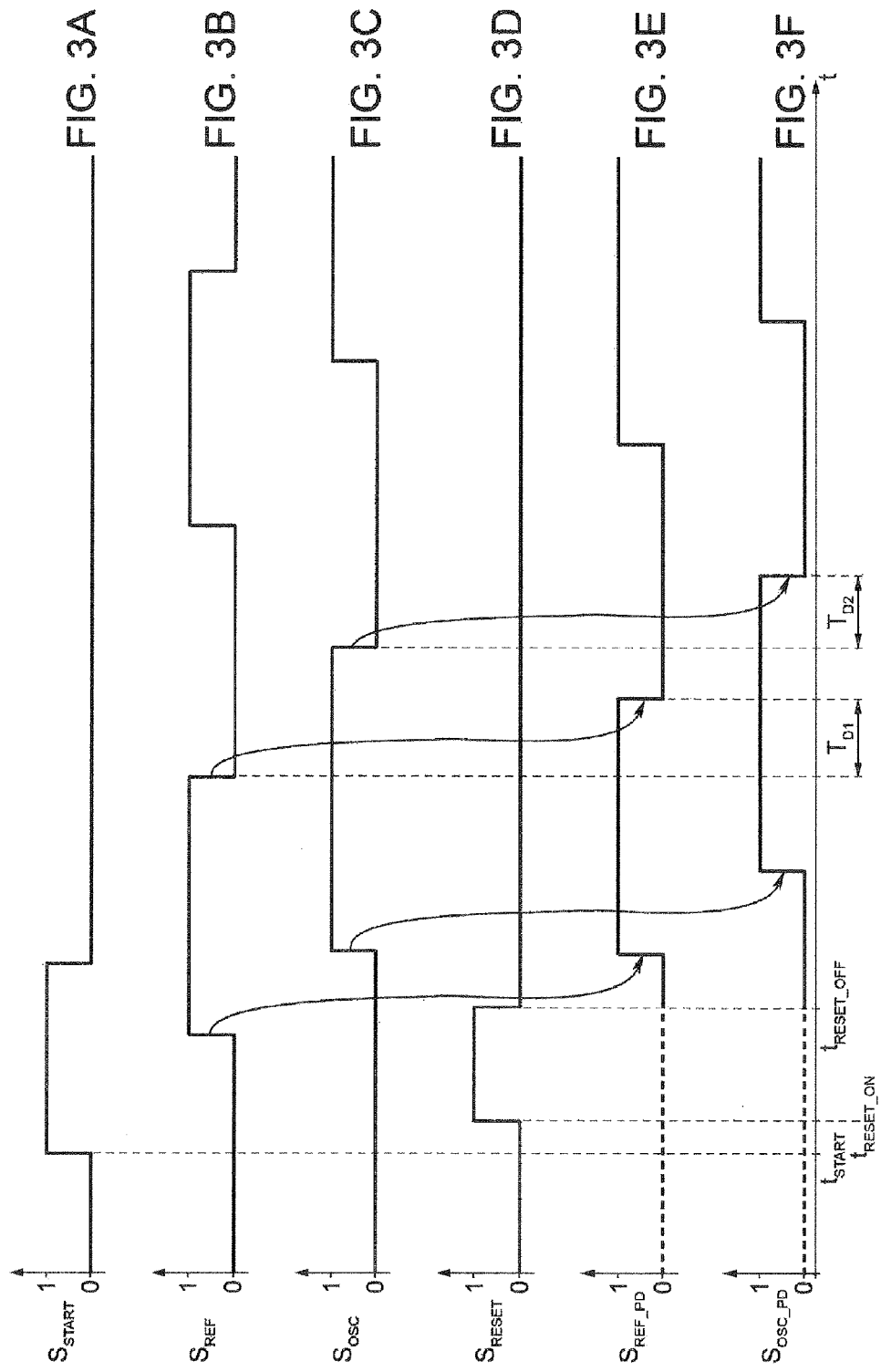

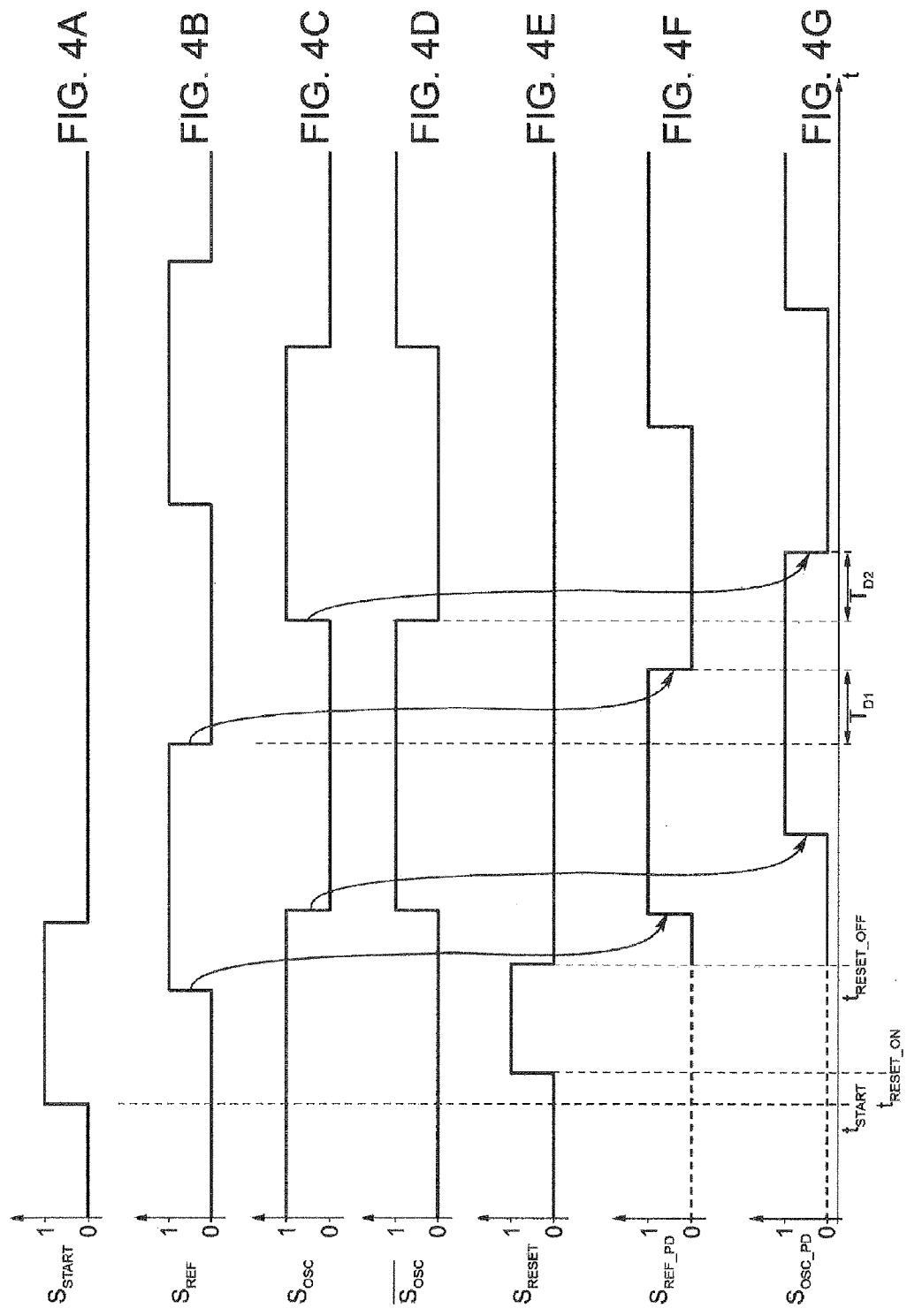

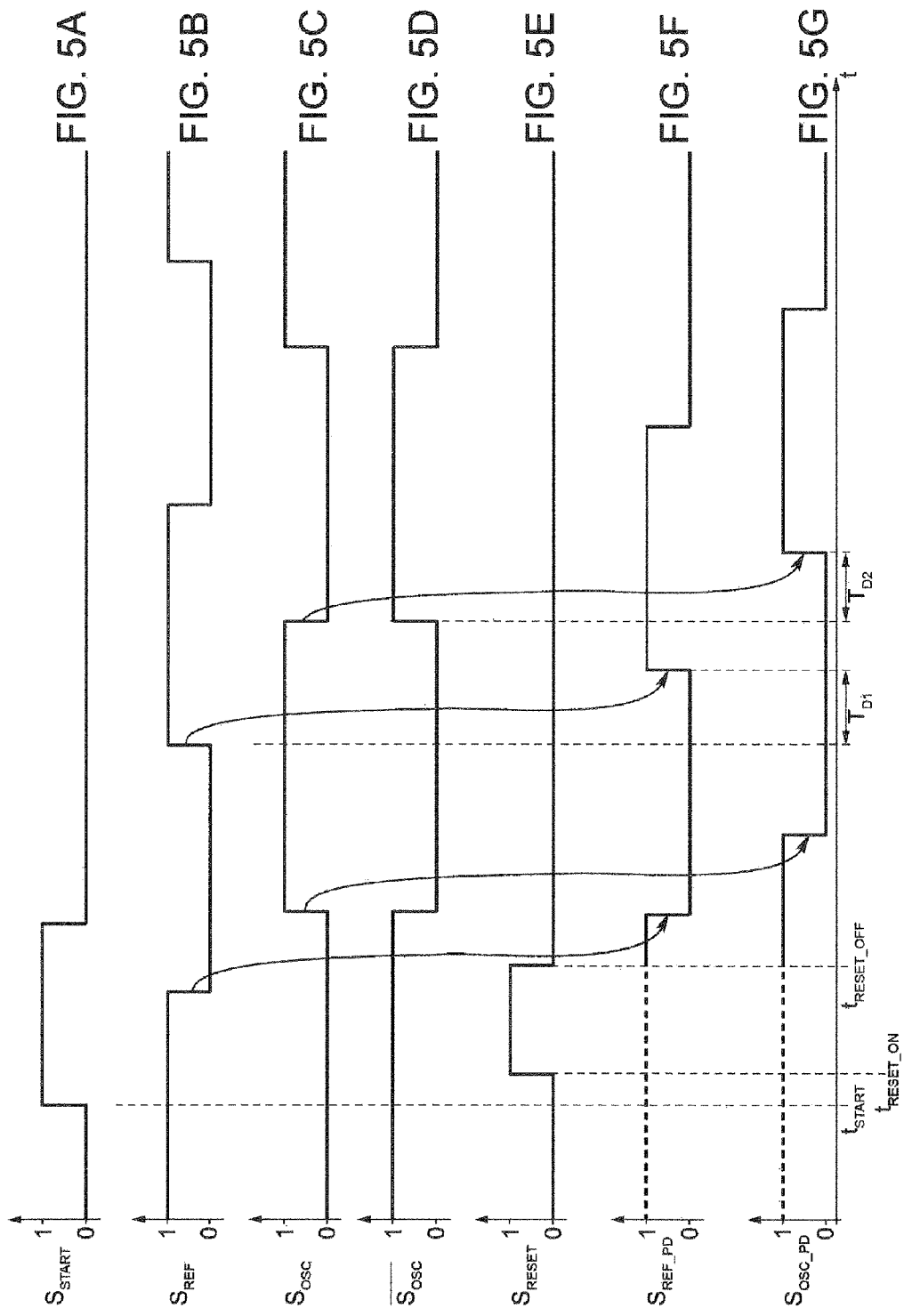

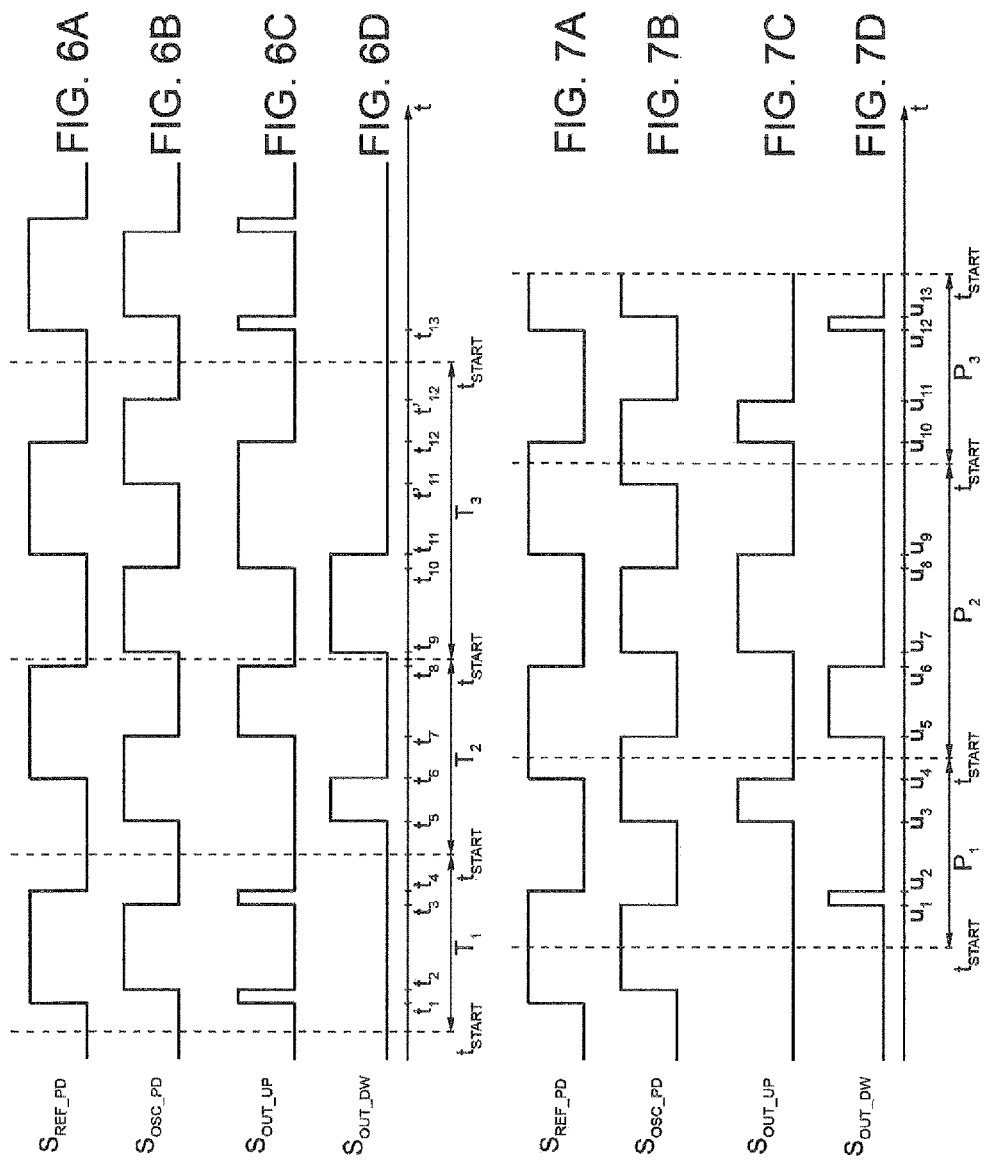

DIGITALLY CONTROLLED OSCILLATOR CALIBRATION CIRCUIT AND METHOD

BACKGROUND

1. Technical Field

The present disclosure relates to a calibration circuit and a calibration method for a digitally controlled oscillator (DCO), e.g., an oscillator configured to generate a clock signal the frequency of which can be trimmed in a discrete way by means of a digital control signal.

2. Description of the Related Art

High-precision amplifiers, in particular for processing signals in microelectromechanical systems (MEMS), use open-loop oscillators for providing operations of amplification, sampling, or chopping in switched-capacitor circuits, and likewise operations of conversion in the digital domain.

These oscillators, the oscillation frequency of which typically does not exceed a few megahertz, undergo coarse calibration or trimming during fast-test procedures. It is desirable to calibrate the oscillators as fast as possible in order to minimize the testing time. On the other hand, for the testing steps, a perfect synchronism between the signal generated by the oscillator and a reference signal is not required.

A circuit for discrete trimming of a voltage-controlled oscillator (VCO) is known, for example, from T. H. Lin et al., "A 900-MHz 2.5-?mA$_{CM}$OS Frequency Synthesizer With An Automatic SC Tuning Loop," IEEE JSSC, 2001. However, said document describes a closed-loop calibration technique, which requires a long calibration time (a PLL circuit must be pre-set before it is possible to generate a result that can be used for calibration purposes).

The document by H. I. Lee et al., "A ΔΣ fractional-N frequency synthesizer using a wideband integrated VCO and a fast AFC technique for GSM/GPRS/WCDMA applications," IEEE JSSC, 2004, describes a circuit for open-loop calibration of an oscillator. However, the calibration time is relatively long, in so far as a plurality of counters are provided, which, in order to supply a usable result, must accumulate a certain number of counts.

BRIEF SUMMARY

According to an embodiment, a digitally controlled oscillator calibration circuit and method are provided.

In an embodiment, a calibration circuit for a digitally controlled oscillator DCO, comprises:
a signal-conditioning module configured to:
(i) receive at input an oscillating signal generated by the DCO and a reference signal, where the oscillating signal and the reference signal are binary signals configured for having a high logic value and a low logic value;
(ii) detect a respective first logic value and second logic value of the reference signal and of the oscillating signal among said high logic value and low logic value;
(iii) generate at output an intermediate reference signal and an intermediate oscillating signal such that, if the first and second logic values are opposite to one another, the intermediate reference signal corresponds to the reference signal, and the intermediate oscillating signal corresponds to the inverted oscillating signal, whereas, if the first and second logic values are equal to one another, the intermediate reference signal and the intermediate oscillating signal correspond to the reference signal and, respectively, to the oscillating signal;
generate a control signal indicating a first operating condition during which the reference signal stably has a high logic value, or, alternatively, a second operating condition during which the reference signal stably has a low logic value; and
a period-to-voltage converter module, coupled to the signal-conditioning module and configured to:
(v) acquire the intermediate reference signal, the intermediate oscillating signal, and the control signal;
(vi) detect a first falling edge transition, from the high logic value to the low logic value, of one between the intermediate reference signal and the intermediate oscillating signal;
(vii) detect a second falling edge transition, from the high logic value to the low logic value, of the other between the intermediate reference signal and the intermediate oscillating signal, immediately subsequent in time to the first falling edge transition;
(viii) detect a first rising edge transition, from the low logic value to the high logic value, of one between the intermediate reference signal and the intermediate oscillating signal;
(ix) detect a second rising edge transition, from the low logic value to the high logic value, of the other between the intermediate reference signal and the intermediate oscillating signal, immediately subsequent in time to the first rising edge transition;
(x) generate, in the first operating condition, a first output signal identifying (a) the time interval elapsing between the first and second falling edge transitions in the case where the first falling edge transition is that of the intermediate reference signal, or (b) the time interval elapsing between the first and second rising edge transitions in the case where the first rising edge transition is that of the intermediate oscillating signal;
(xi) generate, in the first operating condition, a second output signal identifying (c) the time interval elapsing between the first and second falling edge transitions in the case where the first falling edge transition is that of the intermediate oscillating signal, and (d) the time interval elapsing between the first and second rising edge transitions in the case where the first rising edge transition is that of the intermediate reference signal;
(xii) generate, in the second operating condition, a first output signal identifying (e) the time interval elapsing between the first and second falling edge transitions in the case where the first falling edge transition is that of the intermediate oscillating signal, or (f) the time interval elapsing between the first and second rising edge transitions in the case where the first rising edge transition is that of the intermediate reference signal; and
(xiii) generate, in the second operating condition, a second output signal identifying (g) the time interval elapsing between the first and second falling edge transitions in the case where the first falling edge transition is that of the intermediate reference signal, and (h) the time interval elapsing between the first and second rising edge transitions in the case where the first rising edge transition is that of the intermediate oscillating signal.

In an embodiment, the first output signal includes a time window having a duration indicative of the time interval elapsing: between the first and second falling edge of the intermediate reference signal according to case (a) of step (x); between the first and second rising edge of the intermediate oscillating signal according to case (b) of step (x); between the first and second falling edge of the intermediate oscillating signal according to case (e) of step (xii); and between the first and second rising edge of the intermediate reference signal according to case (f) of step (xii), and the second output signal includes a time window having a duration indicative of the time interval elapsing: between the first and second falling edge of the intermediate oscillating signal according to case (c) of step (xi); between the first and second rising edge of the intermediate reference signal according to case (d) of step (xi); between the first and second falling edge of the intermediate reference signal according to case (g) of step (xiii); and between the first and second rising edge of the intermediate oscillating signal according to case (h) of step (xiii). In an embodiment, the calibration circuit is configured to verify whether, prior to step (iv), a condition of stability is satisfied, said condition of stability being satisfied when the reference signal and the oscillating signal ($S_{OSC}$) both maintain a respective high logic level ("1") or low logic level ("0") for a time equal to or longer than a predefined time interval. In an embodiment, the conditioning module is further configured to generate a reset signal configured for inhibiting operation of the period-to-voltage converter module during an initial operating interval in which the reference signal and the oscillating signal do not satisfy said condition of stability. In an embodiment, the period-to-voltage converter module is further configured to generate, after executing the operations (vi)-(xiii), an end-of-operation signal configured to identify that the generation of the first and second output signals is completed. In an embodiment, the calibration circuit comprises a charge pump, coupled to the period-to-voltage converter module for receiving the first and second output signals, and an electric-charge-accumulation element, coupled to the charge pump, wherein the charge pump is configured to charge the electric-charge-accumulation element on the basis of the first output signal and to discharge the electric-charge-accumulation element on the basis of the second output signal. In an embodiment, the calibration circuit comprises a first comparator coupled to the period-to-voltage converter module and configured for: acquiring a voltage value on the electric-charge-accumulation element; executing a first comparison between the voltage value acquired and a first reference value; and generating a first comparison signal indicating a result of said first comparison. In an embodiment, the calibration circuit comprises a second comparator coupled to the period-to-voltage converter module and configured to: acquire the voltage value on the electric-charge-accumulation element; make a second comparison between the voltage value acquired and a second reference value; and generate a second comparison signal indicating a result of said second comparison. In an embodiment, the calibration circuit comprises a control logic coupled to the first and second comparators to receive the first and second comparison signals and, on the basis of the first and second comparison signals, identify which condition is verified from among: (i) the period of the reference signal is longer than the period of the oscillating signal; (l) the period of the reference signal is shorter than the period of the oscillating signal; (m) the period of the reference signal and the period of the oscillating signal are approximately equal, the control logic being moreover coupled to the DCO and being configured to increase the period of the oscillating signal only if the condition (i) is verified, and reduce the period of the oscillating signal only if the condition (l) is verified. In an embodiment, the control logic is configured to: identify the condition (i) when the second comparison signal identifies a voltage value on the electric-charge-accumulation element higher than the second reference value; identify the condition when the first comparison signal identifies a voltage value on the electric-charge-accumulation element lower than the first reference value; and identify the condition (m) when the first and second comparison signals identify a voltage value on the electric-charge-accumulation element comprised between the first and second reference values.

In an embodiment, a calibration method for a digitally controlled oscillator DCO, comprises: (i) acquiring an oscillating signal, generated by the DCO, and a reference signal, where the oscillating signal and the reference signal are signals of a binary type configured for assuming a high logic value ("1") and a low logic value ("0"); (ii) detecting a respective first logic value and second logic value of the reference signal and of the oscillating signal between said high logic value and said low logic value; (iii) generating an intermediate reference signal and an intermediate oscillating signal such that, if the first and second logic levels are opposite to one another, the intermediate reference signal corresponds to the reference signal, and the intermediate oscillating signal corresponds to the inverted oscillating signal, whereas, if the first and second logic levels are equal to one another, the intermediate reference signal and the intermediate oscillating signal ($S_{OSC\_PD}$) correspond to the reference signal and to the oscillating signal, respectively; (iv) generating a control signal indicating a first operating condition in which the reference signal stably assumes the high logic value ("1"), and a second operating condition in which the reference signal stably assumes the low logic value ("0"); (v) detecting a first falling edge transition, from the high logic value ("1") to the low logic value ("0"), of one between the intermediate reference signal and the intermediate oscillating signal; (vi) detecting a second falling edge transition, from the high logic value ("1") to the low logic value ("0"), of the other between the intermediate reference signal and the intermediate oscillating signal, immediately subsequent in time to the first falling edge transition; (vii) detecting a first rising edge transition, from the low logic value ("0") to the high logic value ("1"), of one between the intermediate reference signal and the intermediate oscillating signal; (viii) detecting a second rising edge transition, from the low logic value ("0") to the high logic value ("1"), of the other between the intermediate reference signal and the intermediate oscillating signal, immediately subsequent in time to the first rising edge transition; (ix) generating, in the first operating condition, a first output signal identifying (a) the time interval elapsing between the first and second falling edge transitions in the case where the first falling edge transition is that of the intermediate reference signal, or (b) the time interval elapsing between the first and second rising edge transitions in the case where the first rising edge transition is that of the intermediate oscillating signal; (x) generating, in the first operating condition, a second output signal identifying (c) the time interval elapsing between the first and second falling edge transitions in the case where the first falling edge transition is that of the intermediate oscillating signal, and (d) the time interval elapsing between the first and second rising edge transitions in the case where the first rising edge transition is that of the intermediate reference signal; (xi) generating, in the second operating condition, a first output signal identifying (e) the time interval elapsing between the first and second falling edge transitions in the case where the first falling edge transition is that of the intermediate oscillating signal, or (f) the time interval elapsing between the first and second rising edge transitions in the case where the first rising edge transition is that of the intermediate reference signal; and (xii) generating, in the second operating condition, a second output signal identifying (g) the time interval elapsing between the first and second falling edge transitions in the case where the first falling edge transition is that of the intermediate reference signal, and (h) the time interval elapsing between the first and second rising edge transitions in the case where the first rising edge transition is that of the intermediate oscillating signal. In an embodiment, the step of generating the first output signal includes generating a time window having a duration indicative of the time interval elapsing: between the first and second falling edge transitions of the intermediate reference signal according to case (a) of step (ix); between the first and second rising edge transitions of the intermediate oscillating signal according to case (b) of step (ix); between the first and second falling edge transitions of the intermediate oscillating signal according to case (e) of step (xi); between the first and second rising edge transitions of the intermediate reference signal according to case (f) of step (xi), and wherein the step of generating the second output signal includes generating a time window having a duration indicative of the time interval elapsing: between the first and second falling edge transitions of the intermediate oscillating signal according to case (c) of step (x); between the first and second rising edge transitions of the intermediate reference signal according to case (d) of step (x); between the first and second falling edge transitions of the intermediate reference signal according to case (g) of step (xii); and between the first and second rising edge transitions of the intermediate oscillating signal according to case (h) of step (xii). In an embodiment, the calibration method comprises the step of verifying whether, prior to step (iv), a condition of stability is satisfied, including the step of detecting whether the reference signal and the oscillating signal maintain a respective high logic level ("1") or low logic level ("0") for a time equal to or longer than a predefined time interval. In an embodiment, the calibration method comprises generating a reset signal designed to inhibit execution of steps (ix)-(xii) during an operating interval in which the condition of stability is not satisfied. In an embodiment, the calibration method comprises, after executing steps (v)-(xii), generating an end-of-operation signal designed to identify that generation of the first and second output signals is completed. In an embodiment, the calibration method comprises: supplying the first and second output signals to a charge pump; governing the charge pump by means of the first output signal for charging an electric-charge-accumulation element; and governing the charge pump by means of the second output signal for discharging the electric-charge-accumulation element. In an embodiment, the calibration method comprises: acquiring a voltage value on the electric-charge-accumulation element; executing a first comparison between the voltage value acquired and a first reference value; and generating a first comparison signal indicating a result of said first comparison. In an embodiment, the calibration method comprises: acquiring the voltage value on the electric-charge-accumulation element; making a second comparison between the voltage value acquired and a second reference value; and generating a second comparison signal indicating a result of said second comparison. In an embodiment, the calibration method comprises: identifying, on the basis of the first and second comparison signals, which condition is verified from among: (i) the period of the reference signal is longer than the period of the oscillating signal; (l) the period of the reference signal is shorter than the period of the oscillating signal; (m) the period of the reference signal and the period of the oscillating signal are approximately equal; and controlling the DCO in such a way as to increase the period of the oscillating signal only if the condition (i) is verified; and reducing the period of the oscillating signal only if the condition (l) is verified. In an embodiment, the calibration method comprises the steps of: identifying the condition (i) when the second comparison signal identifies a voltage value on the electric-charge-accumulation element higher than the second reference value; identifying the condition (l) when the first comparison signal identifies a voltage value on the electric-charge-accumulation element lower than the first reference value; and identifying the condition (m) when the first and second comparison signals identify a voltage value on the electric-charge-accumulation element comprised between the first and second reference values.

In an embodiment, a device comprises: a signal conditioner configured to receive an oscillating binary signal and a reference binary signal and to output an intermediate oscillating binary signal, an intermediate reference binary signal and a control signal indicative of a stable condition of at least one of the binary signals; and a converter coupled to the signal conditioner and configured to: detect transition edges of the intermediate oscillating binary signal and the intermediate reference binary signal; generate first and second control signals indicative of time intervals between edge transitions based on detected edge transitions and the control signal indicative of a condition of the at least one of the binary signals. In an embodiment, the received oscillating binary signal is generated by a digitally controlled oscillator. In an embodiment, the signal conditioner is configured to: detect a logic value of the oscillating binary signal and a logic value of the reference binary signal; if the detected logic value of the oscillating binary signal is equal to the detected logic value of the reference binary signal, generate the intermediate oscillating binary signal based on the oscillating binary signal and generate the intermediate reference binary signal based on the reference binary signal; and if the detected logic value of the oscillating binary signal is not equal to the detected logic value of the reference binary signal, generate the intermediate oscillating binary signal based on an inverted oscillating binary signal and generate the intermediate reference binary signal based on the reference binary signal. In an embodiment, wherein the control signal indicative of a condition of at least one of the binary signals indicates whether the reference binary signal has a stable high logic value or a stable low logic value. In an embodiment, the converter is configured to: detect a first falling edge transition, from a high logic value to a low logic value, of one between the intermediate reference binary signal and the intermediate oscillating binary signal; detect a second falling edge transition, from the high logic value to the low logic value, of the other between the intermediate reference binary signal and the intermediate oscillating binary signal, subsequent in time to the first falling edge transition; detect a first rising edge transition, from the low logic value to the high logic value, of one between the intermediate reference binary signal and the intermediate oscillating binary signal; and detect a second rising edge transition, from the low logic value to the high logic value, of the other between the intermediate reference binary signal and the intermediate oscillating binary signal, subsequent in time to the first rising edge transition, wherein if the control signal indicative of the condition indicates the reference binary signal has a stable high logic value, the converter is configured to: generate the first control signal indicative of time intervals based on a time interval elapsing between the first and second falling edge transitions if the first falling edge transition is of the intermediate reference binary signal; generate the first control signal indicative of time intervals based on a time interval elapsing between the first and second rising edge transitions if the first rising edge transition is of the intermediate oscillating binary signal; generate the second control signal indicative of time intervals based on a time interval elapsing between the first and second falling edge transitions if the first falling edge transition is of the intermediate oscillating binary signal; and generate the second control signal indicative of time intervals based on a time interval elapsing between the first and second rising edge transitions if the first rising edge transition is of the intermediate reference binary signal; and if the control signal indicative of the condition indicates the reference binary signal has a stable low logic value, the converter is configured to: generate the first control signal indicative of time intervals based on a time interval elapsing between the first and second falling edge transitions if the first falling edge transition is of the intermediate oscillating binary signal; generate the first control signal indicative of time intervals based on a time interval elapsing between the first and second rising edge transitions if the first rising edge transition is of the intermediate reference binary signal; generate the second control signal indicative of time intervals based on a time interval elapsing between the first and second falling edge transitions if the first falling edge transition is of the intermediate reference binary signal; and generate the second control signal indicative of time intervals based on a time interval elapsing between the first and second rising edge transitions if the first rising edge transition is of the intermediate oscillating signal. In an embodiment, the converter is configured to generate the first control signal indicative of time intervals by generating a signal having a duration indicative of a time interval. In an embodiment, the signal conditioner is configured to determine whether the oscillating binary signal and the reference binary signal are stable for a threshold period of time before generating the control signal indicative of a condition of the at least one of the binary signals. In an embodiment, the signal conditioner is configured to generate a reset signal to inhibit operation of the converter based on the determination of whether the oscillating binary signal and the reference binary signal are stable for the threshold period of time. In an embodiment, the converter is configured to generate an end-of-operation signal to indicate generation of the first and second control signals indicative of time intervals is complete. In an embodiment, the device includes: a charge pump, coupled to the converter and configured to receive the first and second control signals indicative of time intervals; and an electric-charge-accumulation element, coupled to the charge pump, wherein the charge pump is configured to charge the electric-charge-accumulation element based on the first control signal indicative of time intervals and to discharge the electric-charge-accumulation element based on the second control signal indicative of time intervals. In an embodiment, the device includes a first comparator coupled to the converter and configured to compare a voltage value on the electric-charge-accumulation element to a first reference value and generate a first comparison signal indicating a result of said comparison of the voltage value on the electric-charge-accumulation element to the first reference value. In an embodiment, the device includes a second comparator coupled to the converter and configured to compare the voltage value on the electric-charge-accumulation element to a second reference value and generate a second comparison signal indicating a result of said comparison of the voltage value on the electric-charge-accumulation element to the second reference value. In an embodiment, the device includes control logic coupled to the first and second comparators and configured to generate at least one signal to control a digitally controlled oscillator (DCO) generating the oscillating binary signal, wherein the control logic is configured to: generate the at least one signal to control the DCO to increase a period of the oscillating binary signal if the first and second comparison signals indicate a period of the reference binary signal is longer than a period of the oscillating signal; and generate the at least one signal to control the DCO to decrease the period of the oscillating binary signal if the first and second comparison signals indicate the period of the reference binary signal is shorter that the period of the oscillating binary signal. In an embodiment, the control logic is configured to: generate the at least one signal to control the DCO to increase the period of the oscillating binary signal when the second comparison signal indicates the voltage value on the electric-charge-accumulation element is higher than the second reference value; generate the at least one signal to control the DCO to decrease the period of the oscillating binary signal when the first comparison signal indicates the voltage value on the electric-charge-accumulation element is lower than the first reference value; and generate an indication that the period of the oscillating binary signal and the period of the reference binary signal are approximately equal when the first and second comparison signals indicate the voltage value on the electric-charge-accumulation element is between the first and second reference values.

In an embodiment, a method comprises: receiving an oscillating binary signal and a reference binary signal; outputting an intermediate oscillating binary signal, an intermediate reference binary signal and a control signal indicative of a stable condition of at least one of the binary signals; detecting transition edges of the intermediate oscillating binary signal and the intermediate reference binary signal; generating first and second control signals indicative of time intervals between edge transitions based on detected edge transitions and the control signal indicative of a condition of the at least one of the binary signals. In an embodiment, the method includes controlling a digitally controlled oscillator (DCO) configured to generate the received oscillating binary signal based on the first and second control signals indicative of time intervals. In an embodiment, the method includes: detecting a logic value of the oscillating binary signal and a logic value of the reference binary signal; if the detected logic value of the oscillating binary signal is equal to the detected logic value of the reference binary signal, generating the intermediate oscillating binary signal based on the oscillating binary signal and generating the intermediate reference binary signal based on the reference binary signal; and if the detected logic value of the oscillating binary signal is not equal to the detected logic value of the reference binary signal, generating the intermediate oscillating binary signal based on an inverted oscillating binary signal and generating the intermediate reference binary signal based on the reference binary signal. In an embodiment, the control signal indicative of a condition of at least one of the binary signals indicates whether the reference binary signal has a stable high logic value or a stable low logic value. In an embodiment, the method includes: detecting a first falling edge transition, from a high logic value to a low logic value, of one between the intermediate reference binary signal and the intermediate oscillating binary signal; detecting a second falling edge transition, from the high logic value to the low logic value, of the other between the intermediate reference binary signal and the intermediate oscillating binary signal, subsequent in time to the first falling edge transition; detecting a first rising edge transition, from the low logic value to the high logic value, of one between the intermediate reference binary signal and the intermediate oscillating binary signal; detecting a second rising edge transition, from the low logic value to the high logic value, of the other between the intermediate reference binary signal and the intermediate oscillating binary signal, subsequent in time to the first rising edge transition; when the control signal indicative of the condition indicates the reference binary signal has a stable high logic value, generating the first and second control signals indicative of time intervals includes: generating the first control signal indicative of time intervals based on a time interval elapsing between the first and second falling edge transitions if the first falling edge transition is of the intermediate reference binary signal; generating the first control signal indicative of time intervals based on a time interval elapsing between the first and second rising edge transitions if the first rising edge transition is of the intermediate oscillating binary signal; generating the second control signal indicative of time intervals based on a time interval elapsing between the first and second falling edge transitions if the first falling edge transition is of the intermediate oscillating binary signal; and generate the second control signal indicative of time intervals based on a time interval elapsing between the first and second rising edge transitions if the first rising edge transition is of the intermediate reference binary signal; and when the control signal indicative of the condition indicates the reference binary signal has a stable low logic value, generating the first and second control signals indicative of time intervals includes: generating the first control signal indicative of time intervals based on a time interval elapsing between the first and second falling edge transitions if the first falling edge transition is of the intermediate oscillating binary signal; generating the first control signal indicative of time intervals based on a time interval elapsing between the first and second rising edge transitions if the first rising edge transition is of the intermediate reference binary signal; generating the second control signal indicative of time intervals based on a time interval elapsing between the first and second falling edge transitions if the first falling edge transition is of the intermediate reference binary signal; and generating the second control signal indicative of time intervals based on a time interval elapsing between the first and second rising edge transitions if the first rising edge transition is of the intermediate oscillating signal. In an embodiment, the method includes determining whether the oscillating binary signal and the reference binary signal are stable for a threshold period of time before generating the control signal indicative of a condition of the at least one of the binary signals. In an embodiment, the method includes: charging an electric-charge-accumulation element based on the first control signal indicative of time intervals and discharging the electric-charge-accumulation element based on the second control signal indicative of time intervals. In an embodiment, the method includes: controlling the DCO to increase a period of the oscillating binary signal when the first and second signals indicative of time intervals indicate the period of the oscillating binary signal is less than a period of the reference binary signal; and controlling the DCO to decrease the period of the oscillating binary signal when the first and second signals indicative of time intervals indicate the period of the oscillating binary signal is greater than the period of the reference binary signal.

In an embodiment, a system comprises: a digitally controlled oscillator (DCO) configured to generate an oscillating binary signal; a signal conditioner coupled to the DCO and configured to receive the oscillating binary signal and a reference binary signal and to output an intermediate oscillating binary signal, an intermediate reference binary signal and a control signal indicative of a stable condition of at least one of the binary signals; and a converter coupled to the signal conditioner and configured to: detect transition edges of the intermediate oscillating binary signal and the intermediate reference binary signal; generate first and second control signals indicative of time intervals between edge transitions based on detected edge transitions and the control signal indicative of a condition of the at least one of the binary signals. In an embodiment, the signal conditioner is configured to: detect a logic value of the oscillating binary signal and a logic value of the reference binary signal; if the detected logic value of the oscillating binary signal is equal to the detected logic value of the reference binary signal, generate the intermediate oscillating binary signal based on the oscillating binary signal and generate the intermediate reference binary signal based on the reference binary signal; and if the detected logic value of the oscillating binary signal is not equal to the detected logic value of the reference binary signal, generate the intermediate oscillating binary signal based on an inverted oscillating binary signal and generate the intermediate reference binary signal based on the reference binary signal. In an embodiment, the control signal indicative of a condition of at least one of the binary signals indicates whether the reference binary signal has a stable high logic value or a stable low logic value.

In an embodiment, a system comprises: means for generating an intermediate oscillating binary signal based on an oscillating binary signal, generating an intermediate reference binary signal based on a reference binary signal, and generating a control signal indicative of a stable condition of at least one of the binary signals; means for detecting transition edges of the intermediate oscillating binary signal and the intermediate reference binary signal; and means for generating first and second control signals indicative of time intervals between edge transitions based on detected edge transitions and the control signal indicative of a condition of the at least one of the binary signals. In an embodiment, the system includes: a digitally controlled oscillator (DCO); and means for controlling the DCO based on the first and second control signals indicative of time intervals.

BRIEF DESCRIPTION OF THE SEVERAL VIEWS OF THE DRAWINGS

For a better understanding of the present disclosure, example embodiments are now described, purely by way of non-limiting example, with reference to the attached drawings, wherein:

FIGS. 2A-2F show, using a common time scale, signals at input to and at output from the signal-conditioning module of FIG. 1 in order to illustrate operation thereof in one operating condition;

FIGS. 3A-3F show, using a common time scale, signals at input to and at output from the signal-conditioning module of FIG. 1 in order to illustrate operation thereof in a different operating condition;

FIGS. 4A-4G show, using a common time scale, signals at input to and at output from the signal-conditioning module of FIG. 1 in order to illustrate operation thereof in a further operating condition;

FIGS. 5A-5G show, using a common time scale, signals at input to and at output from the signal-conditioning module of FIG. 1 in order to illustrate operation thereof in yet a further operating condition;

FIGS. 6A-6D show, using a common time scale, signals at input to and at output from the period-to-voltage converter module of FIG. 1 in order to illustrate operation thereof in one operating condition;

FIGS. 7A-7D show, using a common time scale, signals at input to and at output from the period-to-voltage converter module of FIG. 1 in order to illustrate operation thereof in a further operating condition;

DETAILED DESCRIPTION

Figure 1:
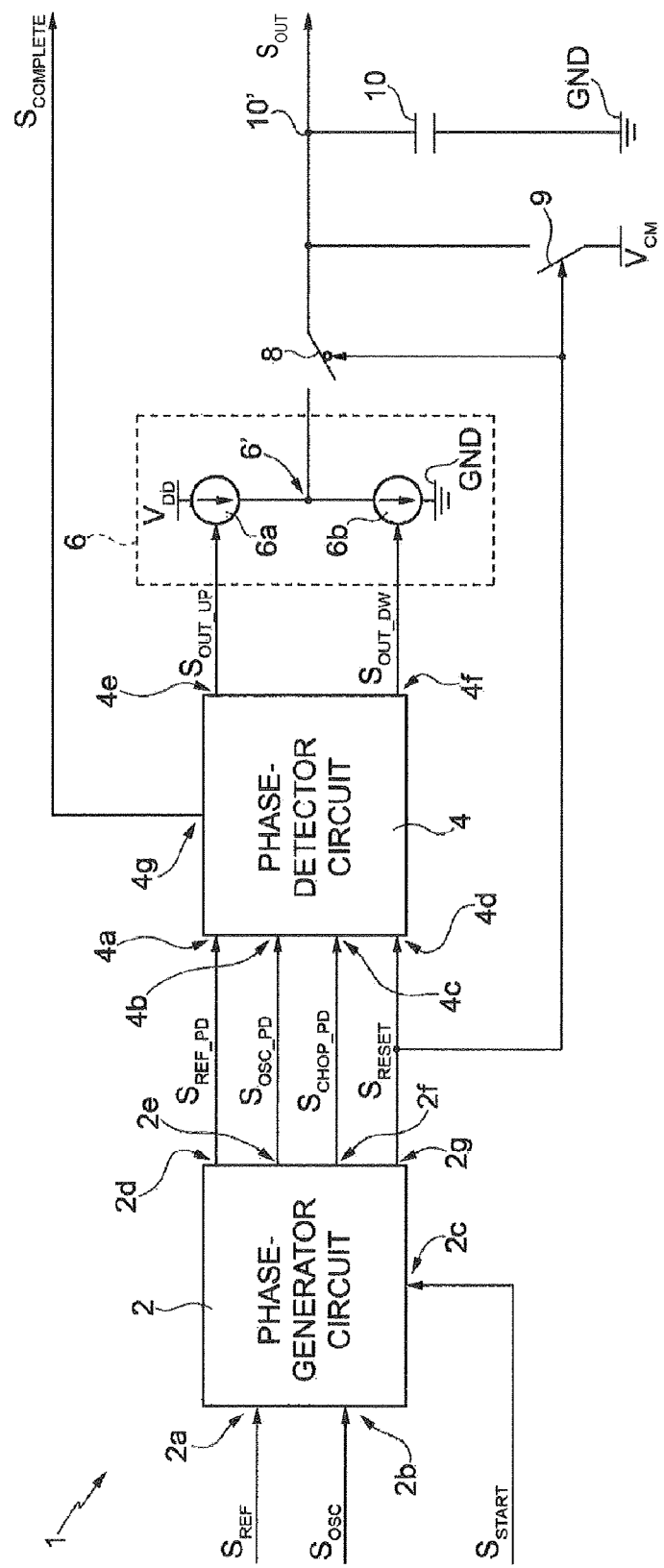
FIG. 1 shows a period-to-voltage converter circuit including a signal-conditioning module and a period-to-voltage converter module, according to one embodiment.

In the following description, certain details are set forth in order to provide a thorough understanding of various embodiments of devices, methods and articles. However, one of skill in the art will understand that other embodiments may be practiced without these details. In other instances, well-known structures and methods associated with, for example, signal processing devices, logic gates, etc., have not been shown or described in detail in some figures to avoid unnecessarily obscuring descriptions of the embodiments.

Unless the context requires otherwise, throughout the specification and claims which follow, the word "comprise" and variations thereof, such as "comprising," and "comprises," are to be construed in an open, inclusive sense, that is, as "including, but not limited to."

Reference throughout this specification to "one embodiment," "a first embodiment," "an embodiment," etc., means that a particular feature, structure or characteristic described in connection with the embodiment is included in at least one embodiment. Thus, the appearances of the phrases "in one embodiment," or "in an embodiment" in various places throughout this specification are not necessarily referring to the same embodiment, or to all embodiments. Furthermore, the particular features, structures, or characteristics may be combined in any suitable manner in one or more embodiments to obtain further embodiments.

The headings are provided for convenience only, and do not interpret the scope or meaning of this disclosure.

The sizes and relative positions of elements in the drawings are not necessarily drawn to scale. For example, the shapes of various elements and angles are not drawn to scale, and some of these elements are arbitrarily enlarged and positioned to improve drawing legibility. Further, the particular shapes of the elements as drawn are not necessarily intended to convey any information regarding the actual shape of particular elements, and have been selected solely for ease of recognition in the drawings.

FIG. 1 shows schematically by means of a block diagram a time-to-voltage converter circuit 1, also known as "period-to-voltage converter circuit", according to one embodiment. The time-to-voltage converter circuit receives at input a reference signal $S_{REF}$ (for example, supplied by a clock-signal generator) and an oscillating signal $S_{OSC}$ (for example, supplied by a digitally controlled oscillator—DCO), and produces an output signal $S_{OUT}$ indicating the difference in frequency (or period) between the reference signal $S_{REF}$ and the oscillating signal $S_{OSC}$. On the basis of the output signal $S_{OUT}$, it is possible to regulate the frequency of the oscillating signal $S_{OSC}$ in such a way as to lock it within a predefined sub-band range, centered around the reference frequency $S_{REF}$.

The time-to-voltage converter circuit 1 comprises a phase-generator block 2 and a phase-detector block 4, connected in communication to one another in such a way that electrical signals (current and/or voltage) generated at output from the phase-generator block 2 are received at input by the phase-detector block 4.

The phase-generator block 2 receives, on a first input 2a, the reference signal $S_{REF}$, for example a square-wave voltage signal having a pre-set frequency, supplied by a clock-signal generator, which is of a type in itself known and is not shown herein.

Figure 11:
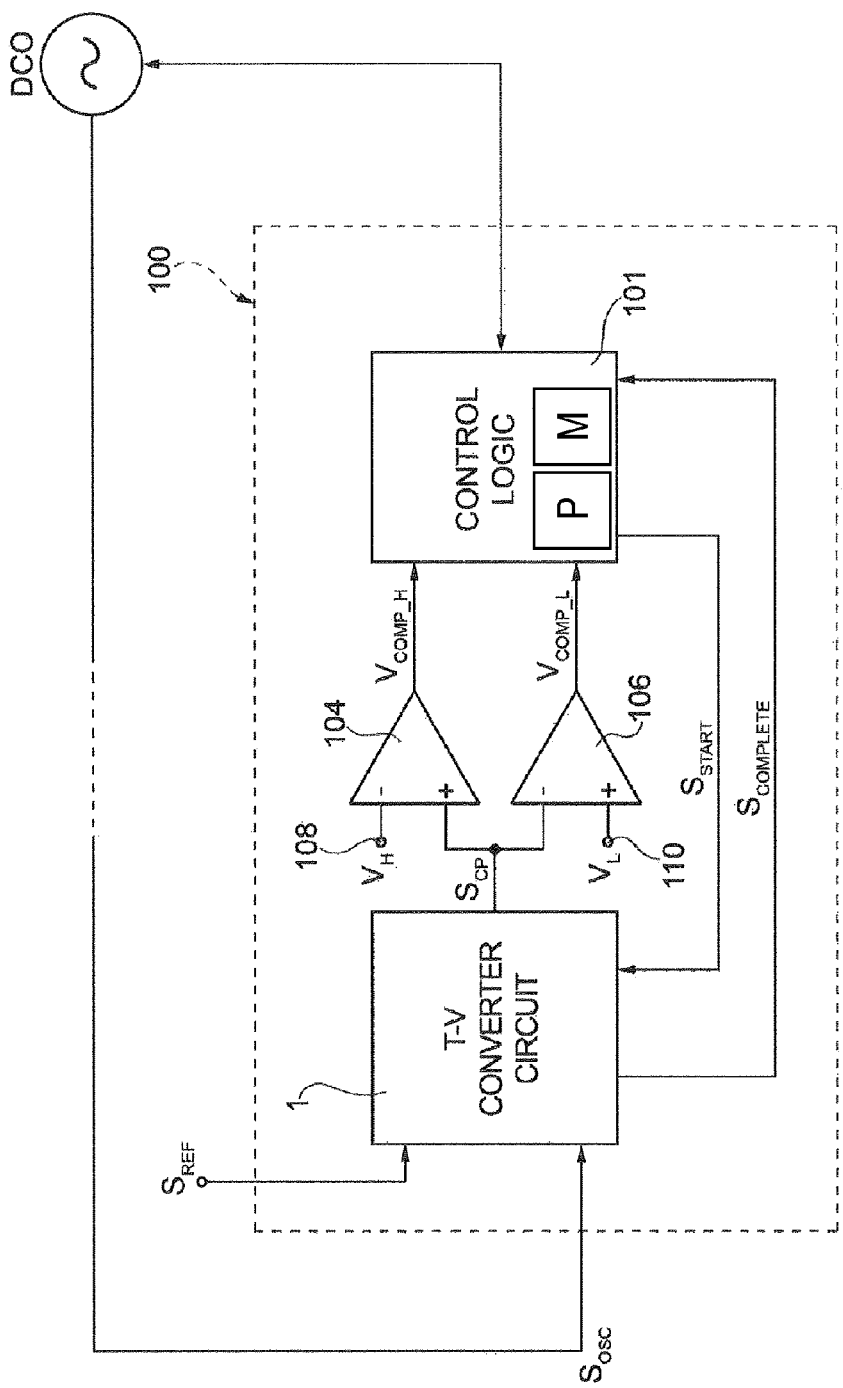
FIG. 11 shows an embodiment of a system including a period-to-voltage converter circuit.

Moreover, the phase-generator block 2 receives, on a second input 2b, the oscillating signal $S_{OSC}$, for example a square-wave voltage signal having an oscillation frequency of its own, generated, for example, by a DCO of a type in itself known and schematically illustrated in FIG. 11. Moreover, the phase-generator block 2 receives, on a third input 2c, an enable signal $S_{START}$, configured to start operation of the phase-generator block 2. The enable signal $S_{START}$ is, for example, supplied by a control logic, not illustrated.

On the basis of the signals that it receives at input, the phase-generator block 2 produces output signals, which are supplied to the phase-detector block 4. In detail, the phase-generator block 2 generates on a first output 2d an intermediate reference signal $S_{REF\_PD}$, correlated to the reference signal $S_{REF}$; moreover, the phase-generator block 2 generates on a second output 2e an intermediate oscillating signal $S_{OSC\_PD}$, correlated to the oscillating signal $S_{OSC}$; moreover, the phase-generator block 2 generates on a third output 2f a control signal $S_{CHOP\_PD}$ and, on a fourth output 2g, a reset signal $S_{RESET}$. The latter two signals $S_{CHOP\_PD}$ and $S_{RESET}$ are signals for controlling internal operation of the phase-detector block 4, and are illustrated in greater detail hereinafter, with reference to the detailed description of the phase-detector block 4.

As illustrated in the figure, the first output 2d of the phase-generator block 2 is coupled to a first input 4a of the phase-detector block 4 so as to supply the intermediate reference signal $S_{REF\_PD}$ to the phase-detector block 4; the second output 2e is coupled to a second input 4b of the phase-detector block 4 so as to supply the intermediate oscillating signal $S_{OSC\_PD}$ to the phase-detector block 4; the third output 2f is coupled to a third input 4c of the phase-detector block 4 so as to supply the control signal $S_{CHOP\_PD}$ to the phase-detector block 4; the fourth output 2g is coupled to a fourth input 4d of the phase-detector block 4 so as to supply the reset signal $S_{RESET}$ to the phase-detector block 4.

In turn, the phase-detector block 4 generates, on the basis of the signals that it receives on the input ports 4a-4d, a first output signal $S_{OUT\_UP}$ and a second output signal $S_{OUT\_DW}$, identifying a difference in frequency (or period) between the intermediate reference signal $S_{REF\_PD}$ and the intermediate oscillating signal $S_{OSC\_PD}$. The first output signal $S_{OUT\_UP}$ is supplied on an output port 4e of the phase-detector block 4, and the second output signal $S_{OUT\_DW}$ is supplied on an output port 4f of the phase-detector block 4.

Moreover, the phase-detector block 4 generates on an output port 4g, an end-of-operation signal $S_{COMPLETE}$, indicating the fact that the operations of generation of the first and second output signals $S_{OUT\_UP}$ and $S_{OUT\_DW}$ have been completed. A subsequent step of identification of the difference in frequency between the intermediate reference signal $S_{REF\_PD}$ and the intermediate oscillating signal $S_{OSC\_PD}$ can then be performed on the basis of the first and second output signals $S_{OUT\_UP}$ and $S_{OUT\_DW}$.

Operation of the phase-generator block 2 is described with reference to FIGS. 2-5, which illustrate the time plot of the reference signal $S_{REF}$, oscillating signal $S_{OSC}$, intermediate reference signal $S_{REF\_PD}$, and intermediate oscillating signal $S_{OSC\_PD}$ for respective initial instants $t_{START}$ at which: the reference signal $S_{REF}$ and the oscillating signal $S_{OSC}$ both have a high logic value "1" (FIG. 2); the reference signal $S_{REF}$ and the oscillating signal $S_{OSC}$ both have a low logic value "0"

(FIG. 3); the reference signal $S_{REF}$ has a low logic value "0" and the oscillating signal $S_{OSC}$ has a high logic value "1" (FIG. 4); and the reference signal $S_{REF}$ has a high logic value "1" and the oscillating signal $S_{OSC}$ has a low logic value "0" (FIG. 5).

The reference signal $S_{REF}$ and the oscillating signal $S_{OSC}$ are represented as square-wave signals having a constant frequency (period) and such that the frequency of the reference signal $S_{REF}$ is higher than the frequency of the oscillating signal $S_{OSC}$.

Moreover, the signals of FIGS. 2A-2F, 3A-3F, 4A-4G, and 5A-5G are represented with reference to a respective common time base, for ease of understanding. The time values not are indicated in their numerical detail in so far as they are of no importance for the purposes of the description of the corresponding figures.

With reference to FIGS. 2A-2F, it may be noted that at the starting instant $t_{START}$ both the reference signal $S_{REF}$ and the oscillating signal $S_{OSC}$ have a high logic value "1". The enable signal $S_{START}$ passes from the low logic value "0" to the high logic value "1" at $t_{START}$. Transition of the logic level of the enable signal $S_{START}$ causes transition of the logic level, from low to high, of the reset signal $S_{RESET}$, with a certain delay caused by the input-output propagation between the input 2c and the output 2g of the phase-generator block 2. In the initial steps of operation of the phase-generator block 2 it is expedient to assert the reset signal $S_{RESET}$ to high value "1" (reset active, instant $t_{RESET\_ON}$) in order to prevent the intermediate reference signal $S_{REF\_PD}$ and the intermediate oscillating signal $S_{OSC\_PD}$, still not stable, from being acquired by the phase-detector block 4. After a step of verification of the stability of the intermediate reference signal $S_{REF\_PD}$ and intermediate oscillating signal $S_{OSC\_PD}$, the reset signal $S_{RESET}$ passes to a low value "0" (reset deactivated, instant $t_{RESET\_OFF}$), and the intermediate reference signal $S_{REF\_PD}$ and intermediate oscillating signal $S_{OSC\_PD}$ are considered stable and such that they can be acquired at input by the phase-detector block 4 for subsequent operations. For instance, the intermediate reference signal $S_{REF\_PD}$ and intermediate oscillating signal $S_{OSC\_PD}$ are considered stable after a set length of time, which may be pre-set, during which the reference signal $S_{REF}$ and the oscillating signal $S_{OSC}$ have not changed their logic level (e.g., the above time interval is chosen equal to one hundred or a few hundreds of picoseconds). Said time interval can be considered as the aggregate of a plurality of successive time intervals.

The plot of the intermediate reference signal $S_{REF\_PD}$ and intermediate oscillating signal $S_{OSC\_PD}$, during the time interval in which the reset signal $S_{RESET}$ is active, is not illustrated in FIG. 2, in so far as in this time interval said signals are, as has been said, rejected and are not of interest for an understanding of operation of the phase-generator block 2.

After the instant $t_{RESET\_OFF}$, the intermediate reference signal $S_{REF\_PD}$ and intermediate oscillating signal $S_{OSC\_PD}$ are supplied on the respective outputs and acquired by the phase-detector block 4. In particular, the intermediate reference signal $S_{REF\_PD}$ corresponds to the reference signal $S_{REF}$ delayed by a certain time interval $T_{D1}$, whereas the intermediate oscillating signal $S_{OSC\_PD}$ corresponds to the oscillating signal $S_{OSC}$, which is also delayed by a certain time interval $T_{D2}$. In particular, the time intervals $T_{D1}$ and $T_{D2}$ have the same value.

In conclusion, in the case of FIGS. 2E and 2F, the intermediate reference signal $S_{REF\_PD}$ and intermediate oscillating signal $S_{OSC\_PD}$ are delayed copies of the reference signal $S_{REF}$ and the oscillating signal $S_{OSC}$.

With reference to FIGS. 3A-3F, it should be noted that at the starting instant $t_{START}$ both the reference signal $S_{REF}$ and the oscillating signal $S_{OSC}$ have a low logic value "0".

What has been described with reference to FIGS. 2A-2F as regards the plot of the enable signal $S_{START}$ and reset signal $S_{RESET}$ applies also in this case. In particular, the intermediate reference signal $S_{REF\_PD}$ corresponds to the reference signal $S_{REF}$ delayed by the time interval $T_{D1}$, and the intermediate oscillating signal $S_{OSC\_PD}$ corresponds to the oscillating signal $S_{OSC}$ delayed by the time interval $T_{D2}$ (in particular, $T_{D1}=T_{D2}$).

Similar considerations apply for the intermediate situations of FIGS. 4A-4G and 5A-5G, in which at the initial instant $t_{START}$ the reference signal $S_{REF}$ and the oscillating signal $S_{OSC}$ have logic values opposite to one another. However, in the situations of FIGS. 4A-4G and 5A-5G, the intermediate oscillating signal $S_{OSC\_PD}$ corresponds to the negated oscillating signal $S_{OSC}$ (/$S_{OSC}$) delayed by the time interval $T_{D2}$. Hence, corresponding to a rising edge of the oscillating signal $S_{OSC}$ is a delayed falling edge of the intermediate oscillating signal $S_{OSC\_PD}$, and corresponding to a falling edge of the oscillating signal $S_{OSC}$ is a delayed rising edge of the intermediate oscillating signal $S_{OSC\_PD}$.

In FIGS. 4A and 4B, at $t_{START}$, the reference signal $S_{REF}$ has a low logic value "0" and the oscillating signal $S_{OSC}$ has a high logic value "1". The intermediate reference signal $S_{REF\_PD}$ of FIG. 4G is a copy delayed (by $T_{D1}$) of the reference signal $S_{REF}$, whilst the oscillating signal $S_{OSC\_PD}$ of FIG. 4F is a copy delayed (by $T_{D2}$, in particular, $T_{D2}=T_{D1}$) and negated of the oscillating signal $S_{OSC}$ (i.e., a delayed copy of the signal /$S_{OSC}$ of FIG. 4D).

In FIGS. 5A-5G, at $t_{START}$, the reference signal $S_{REF}$ has a high logic value "1", and the oscillating signal $S_{OSC}$ has a low logic value "0". In a way similar to what has been said with reference to FIGS. 4A-4G, the intermediate reference signal $S_{REF\_PD}$ is a copy delayed (by $T_{D1}$) of the reference signal $S_{REF}$, whilst the oscillating signal $S_{OSC\_PD}$ is a copy delayed (by $T_{D2}$, in particular $T_{D2}=T_{D1}$) and negated of the oscillating signal $S_{OSC}$.

The operations described with reference to FIGS. 4D and 4G (and likewise, FIGS. 5D and 5G) cause the reference signal $S_{REF\_PD}$ and the intermediate oscillating signal $S_{OSC\_PD}$ to be generated on the basis of starting signals (at time $t_{START}$) having the same high logic level "1" or low logic level "0". In fact, in the case where the reference signals $S_{REF}$ and $S_{OSC}$ have different logic levels at time $t_{START}$, one of them is undergoes inversion (in this case, the oscillating signal $S_{OSC}$) in order to go into one of the aforementioned conditions (illustrated in FIGS. 2A-2C and 3A-3C), where the reference signals $S_{REF}$ and $S_{OSC}$ have the same high logic level "1" or low logic level "0" at time $t_{START}$. This simplifies the operations performed by the phase-detector block 4, reducing the complexity of the circuit, its consumption, and its dimensions.

To return to FIG. 1, the control signal $S_{CHOP\_PD}$ generated on the output port 2f of the phase-generator block 2 is a logic signal having a high logic value "1" when operating in the conditions illustrated in FIGS. 3B-3C and 4B-4C, i.e., when, at $t_{START}$, the reference signal $S_{REF}$ and the oscillating signal $S_{OSC}$ both have a low logic value "0" (FIGS. 3B and 3C), or else when, at $t_{START}$, the reference signal $S_{REF}$ has a low logic value "0" and the oscillating signal $S_{OSC}$ has a high logic value "1" (FIGS. 4B and 4C). In the conditions of FIGS. 2B-2C and 5B-5C (the reference signal $S_{REF}$ and the oscillating signal $S_{OSC}$ both have a high logic value "1", or else have respectively a high logic value "1" and a low logic value "0"), the control signal $S_{CHOP\_PD}$ has a low logic value "0".

The information carried by the control signal $S_{CHOP\_PD}$ is used by the phase-detector block 4 for carrying out subsequent operations.

The operations of the phase-detector block 4 are now described with reference to FIGS. 6A-6D and 7A-7D.

FIGS. 6A-6D and 7A-7D show respective the intermediate reference signal $S_{REF\_PD}$ and intermediate oscillating signal $S_{OSC\_PD}$ at input to the phase-detector block 4 and respective output signals $S_{OUT\_UP}$ and $S_{OUT\_DW}$ generated by the phase-detector block 4, so as to display graphically the relation existing between the signals at input to and at output from the phase-detector block 4 in various operating conditions, which exemplify operation of the time-to-voltage converter circuit 1 of FIG. 1.

FIGS. 6A and 6B show, respectively, an intermediate reference signal $S_{REF\_PD}$ and an intermediate oscillating signal $S_{OSC\_PD}$ having respective frequencies (or phases) different from one another. It is assumed that the instant of start of acquisition ($t_{START}$) and the reset interval ($t_{RESET\_ON}$-$t_{RESET\_OFF}$) have already started and ended prior to the first rising edge of one between the intermediate reference signal $S_{REF\_PD}$ and the intermediate oscillating signal $S_{OSC\_PD}$ illustrated in FIGS. 6A and 6B. Moreover, in the example of FIGS. 6A-6D, it is assumed that the control signal $S_{CHOP\_PD}$ has a high logic value "1" (i.e., at the instant $t_{START}$ both the reference signal $S_{REF}$ and the oscillating signal $S_{OSC}$ had a low logic value "0", or else the reference signal $S_{REF}$ had a low logic value "0" and the oscillating signal $S_{OSC}$ had a high logic value "1").

In the case of FIGS. 6A and 6B, the first rising edge is noted is that of the intermediate reference signal $S_{REF\_PD}$, at the instant $t_1$. The first rising edge of the intermediate reference signal $S_{REF\_PD}$, at time $t_1$, generates a corresponding rising edge of the first output signal $S_{OUT\_UP}$. At time $t_2$, subsequent to $t_1$, there may be noted a rising edge also of the intermediate oscillating signal $S_{OSC\_PD}$, which passes from a low logic value "0" to a high logic value "1". The rising edge of the intermediate oscillating signal $S_{OSC\_PD}$ causes a transition of the first output signal $S_{OUT\_UP}$ from a high logic value to a low logic value. Next, at time $t_3$, there may be noted a transition of the intermediate oscillating signal $S_{OSC\_PD}$, which returns to a low logic value. This transition generates a new rising edge of the first output signal $S_{OUT\_UP}$. A subsequent falling edge of the first output signal $S_{OUT\_UP}$, at time $t_4$, is controlled by the falling edge of the intermediate reference signal $S_{REF\_PD}$. Hence, between $t_1$ and $t_4$ (half-period of the signal having lower frequency, here the intermediate reference signal $S_{REF\_PD}$) the first output signal $S_{OUT\_UP}$ assumes a high logic value in time intervals in which the intermediate reference signal $S_{REF\_PD}$ and intermediate oscillating signal $S_{OSC\_PD}$ assume logic values different from one another.

The second output signal $S_{OUT\_DW}$ always remains, in this example, at a low logic value.

The instants $t_1$-$t_4$ are comprised within the time interval $T_1$ (here basically corresponding to the period of the intermediate oscillating signal $S_{OSC\_PD}$).

Once again with reference to FIGS. 6A-6D, considering the instant $t_5$, there may be noted a new rising edge of the intermediate oscillating signal $S_{OSC\_PD}$. In this case, unlike the previous example, the intermediate oscillating signal $S_{OSC\_PD}$ changes its logic state, passing from the low state "0" to a high state "1", before the intermediate reference signal $S_{REF\_PD}$. At time $t_5$, the low-to-high transition of logic state of the intermediate oscillating signal $S_{OSC\_PD}$ causes a transition in logic state, from low "0" to high "1", of the second output signal $S_{OUT\_DW}$, whilst the first output signal $S_{OUT\_UP}$ remains at a low logic value. At time $t_6$, there may be noted a rising edge of the intermediate reference signal $S_{REF\_PD}$, which causes a corresponding falling edge of the second output signal $S_{OUT\_DW}$, bringing it back to a low logic value "0". The first output signal $S_{OUT\_UP}$ assumes a positive value between the instants $t_7$ and $t_8$, or, in other words, between the falling edge of the intermediate oscillating signal $S_{OSC\_PD}$ for the half-period considered and the falling edge of the intermediate reference signal $S_{REF\_PD}$. Also in this case, then, the output signals $S_{OUT\_UP}$ and $S_{OUT\_DW}$ identify the instants at which the intermediate reference signal $S_{REF\_PD}$ and intermediate oscillating signal $S_{OSC\_PD}$ have logic values different from one another.

The instants $t_5$-$t_8$ are comprised within the time interval $T_2$ (here basically corresponding to the period of the intermediate oscillating signal $S_{OSC\_PD}$) immediately subsequent to the time interval $T_1$.

In general, when the control signal $S_{CHOP\_PD}$ has a high logic value "1", the phase-detector block 4 operates as described in what follows. When a rising edge of the intermediate reference signal $S_{REF\_PD}$ that precedes a respective rising edge of the intermediate oscillating signal $S_{OSC\_PD}$ is detected, then the first output signal $S_{OUT\_UP}$ changes its logic state and goes to the high logic value "1"; the first output signal $S_{OUT\_UP}$ remains in the high logic state until also the rising edge of the intermediate oscillating signal $S_{OSC\_PD}$ is acquired, at which instant the first output signal $S_{OUT\_UP}$ returns to the low logic state "0". The second output signal $S_{OUT\_DW}$ does not change its logic state in this situation, and remains in the low logic state "0".

When, instead, a rising edge of the intermediate oscillating signal $S_{OSC\_PD}$ that precedes a respective rising edge of the intermediate reference signal $S_{REF\_PD}$ is detected, then it is the second output signal $S_{OUT\_DW}$ that changes its logic state, rising to a high logic value "1"; the first output signal $S_{OUT\_UP}$ does not change its logic state in this situation and remains in the low logic state "0".

Moreover, in each time interval $T_1$ or $T_2$ considered, the transition of logic state from low "0" to high "1" of the first output signal $S_{OUT\_UP}$ is likewise controlled by a falling edge of the intermediate oscillating signal $S_{OSC\_PD}$ that immediately precedes a falling edge of the intermediate reference signal $S_{REF\_PD}$.

To conclude all the possible cases, there may be a possible falling edge of the intermediate reference signal $S_{REF\_PD}$ preceding the falling edge of the intermediate oscillating signal $S_{OSC\_PD}$ in the time interval considered that causes a transition of logic state, from low to high, of the second output signal $S_{OUT\_DW}$. The transition of logic state from high to low immediately following upon the intermediate oscillating signal $S_{OSC\_PD}$ causes transition from the high logic state to the low logic state of the second output signal $S_{OUT\_DW}$.

We shall now consider, once again with reference to FIGS. 6A-6D, the subsequent time interval $T_3$. In this case, $T_3$ substantially coincides with the period of the intermediate reference signal $S_{REF\_PD}$, the initial instant of which also corresponds to the starting instant of a new period of the intermediate oscillating signal $S_{OSC\_PD}$. In this example, moreover, the period of the intermediate reference signal $S_{REF\_PD}$ is longer than the period of the intermediate oscillating signal $S_{OSC\_PD}$.

It is noted that at time $t_9$ the rising edge of the intermediate oscillating signal $S_{OSC\_PD}$ governs rising of the second output signal $S_{OUT\_DW}$. Then, at time $t_{10}$, the falling edge of the intermediate oscillating signal $S_{OSC\_PD}$ also governs rising of the first output signal $S_{OUT\_UP}$. In this case, the positive half-period of the intermediate oscillating signal $S_{OSC\_PD}$ governs transition of logic state from low to high of the first output signal $S_{OUT\_UP}$ when the second output signal $S_{OUT\_DW}$ is still in the high state "1".

In this condition, both of the output signals have a high logic value "1" simultaneously. As already described, falling of the second output signal $S_{OUT\_DW}$ is governed by rising of the intermediate reference signal $S_{REF\_PD}$ in the time interval $T_3$ considered, and falling (at the instant $t_{12}$) of the first output signal $S_{OUT\_UP}$ is governed by falling of the intermediate reference signal $S_{REF\_PD}$, once again in the time interval $T_3$ considered.

Once again with reference to FIGS. 6A-6D, it is noted that between the instants $t_{11}$ and $t_{12}$ (in particular at $t_{11}'$) the intermediate oscillating signal $S_{OSC\_PD}$ changes its logic state passing from "0" to "1". This transition of state does not cause a respective variation of the first output signal $S_{OUT\_UP}$ or second output signal $S_{OUT\_DW}$. In fact, the phase-detector block 4 is configured in such a way that, in each time interval $T_1$, $T_2$, or $T_3$ considered, each of the output signals $S_{OUT\_UP}$, $S_{OUT\_DW}$ can be subject to a single transition of logic level from low to high and to a single transition of logic level from high to low.

Once the intermediate reference signal $S_{REF\_PD}$ and intermediate oscillating signal $S_{OSC\_PD}$, for example in the time interval $T_3$ considered, have both changed their logic state from low "0" to high "1" and from high "1" to low "0", a further variation of logic state from low "0" to high "1" or from high "1" to low "0" of one between the intermediate reference signal $S_{REF\_PD}$ and the intermediate oscillating signal $S_{OSC\_PD}$ does not produce any new variation of logic state of the output signals $S_{OUT\_UP}$, $S_{OUT\_DW}$. In the case of FIGS. 6A-6D, after the instant $t_{12}$, this situation occurs at the instant $t_{12}'$. In this case, since within the time interval $T_3$ the variation from high "1" to low "0" of the signal $S_{OSC\_PD}$ is (in time) the second variation of this type, said variation does not cause any variation of logic state of the output signals $S_{OUT\_UP}$, $S_{OUT\_DW}$.

In general, we define the interval $t_1$-$t_2$ as $\Delta t_{R1}$, the interval $t_3$-$t_4$ as $\Delta t_{F1}$, the interval $t_5$-$t_6$ as $\Delta t_{R2}$, the interval $t_7$-$t_8$ as $\Delta t_{F2}$, the interval $t_9$-$t_{11}$ as $\Delta t_{R3}$, and the interval $t_{10}$-$t_{12}$ as $\Delta t_{F3}$, then the difference between the period $T_{REF\_PD}$ of the intermediate reference signal $S_{REF\_PD}$ and the period $T_{OSC\_PD}$ of the intermediate oscillating signal $S_{OSC\_PD}$ (corresponding to the difference between the period $T_{REF}$ of the reference signal $S_{REF}$ and the period $T_{OSC}$ of the oscillating signal $S_{OSC}$) obeys the following relation (1):

$$\frac{(T_{REF} - T_{OSC})}{2} = \frac{(T_{REF\_PD} - T_{OSC\_PD})}{2} = +\Delta t_{R1} + \Delta t_{F1} = -\Delta t_{R2} + \Delta t_{F2} = -\Delta t_{R3} + \Delta t_{F3}$$

FIGS. 7A-7B show, respectively, an intermediate reference signal $S_{REF\_PD}$ and an intermediate oscillating signal $S_{OSC\_PD}$ having respective frequencies (or phases) different from one another. It is assumed that the instant of start of acquisition ($t_{START}$) and the reset interval ($t_{RESET\_ON}$-$t_{RESET\_OFF}$) have already started and ended prior to the first falling edge of one between the intermediate reference signal $S_{REF\_PD}$ and the intermediate oscillating signal $S_{OSC\_PD}$ shown in FIGS. 7A and 7B. Moreover, in the example of FIGS. 7A-7D, it is assumed that the control signal $S_{CHOP\_PD}$ has a low logic value "0" (i.e., at the instant $t_{START}$, both the reference signal $S_{REF}$ and the oscillating signal $S_{OSC}$ had a high logic value "1", or else the reference signal $S_{REF}$ had a high logic value "1" and the oscillating signal $S_{OSC}$ had a low logic value "0").

In general, when the control signal $S_{CHOP\_PD}$ has a low logic value "0", the phase-detector block 4 operates as described in what follows. When a rising edge of the intermediate oscillating signal $S_{OSC\_PD}$ that precedes a respective rising edge of the intermediate reference signal $S_{REF\_PD}$ is detected, then the first output signal $S_{OUT\_UP}$ changes its logic state and goes to the high logic value "1". This condition is illustrated in FIG. 7C, for example, at the instants $u_3$ and $u_7$. The first output signal $S_{OUT\_UP}$ remains in the high logic state "1" until also a rising edge of the intermediate reference signal $S_{REF\_PD}$ is acquired, at which instant the first output signal $S_{OUT\_UP}$ returns to the low logic state "0". This condition is illustrated in FIG. 7C, for example, at the instants $u_4$ and $u_9$, with reference to respective time intervals $P_1$ and $P_2$. As may be noted, the duration of the time interval $P_1$ substantially corresponds to the period of the intermediate oscillating signal $S_{OSC\_PD}$, whereas the duration of the time interval $P_2$ substantially corresponds to the period of the intermediate reference signal $S_{REF\_PD}$.

The second output signal $S_{OUT\_DW}$ does not change its logic state in the previous situation and remains in the low logic state "0" between $u_3$ and $u_4$ and between $u_7$ and $u_9$. In other words, the second output signal $S_{OUT\_DW}$ is not controlled by the rising edges of the intermediate reference signal $S_{REF\_PD}$ and intermediate oscillating signal $S_{OSC\_PD}$.

When, instead, a falling edge of the intermediate oscillating signal $S_{OSC\_PD}$ that precedes a respective falling edge of the intermediate reference signal $S_{REF\_PD}$ is detected, then it is the second output signal $S_{OUT\_DW}$ that changes its logic state, rising from the low logic value "0" to the high logic value "1" (for example, with reference to FIG. 7C, at the instants $u_1$ and $u_5$). The second output signal $S_{OUT\_DW}$ remains in the high logic state until also a falling edge of the intermediate reference signal $S_{REF\_PD}$ is acquired, at which instant the second output signal $S_{OUT\_DW}$ returns to the low logic state "0" (for example, with reference to FIG. 7C, at the instants $u_2$ and $u_6$). Hence, the second output signal $S_{OUT\_DW}$ remains in the high logic state "1" between $u_1$ and $u_2$ during the time interval $P_1$ and between $u_5$ and $u_6$ during the time interval $P_2$. The first output signal $S_{OUT\_UP}$ does not change its logic state in this situation and remains in the low logic state "0". In other words, the first output signal $S_{OUT\_UP}$ is not controlled by the falling edges of the intermediate reference signal $S_{REF\_PD}$ and intermediate oscillating signal $S_{OSC\_PD}$.

Moreover, in each time interval considered, the transition of logic state from low "0" to high "1" of the first output signal $S_{OUT\_UP}$ is likewise controlled by a falling edge of the intermediate reference signal $S_{REF\_PD}$ that immediately precedes in time a falling edge of the intermediate oscillating signal $S_{OSC\_PD}$. See, for example, the instant $u_{10}$, where, in the new time interval $P_3$ considered, a falling edge of the intermediate reference signal $S_{REF\_PD}$ precedes a falling edge of the intermediate oscillating signal $S_{OSC\_PD}$ and causes a transition of logic state of the first output signal $S_{OUT\_UP}$ from low to high. The subsequent falling edge of the intermediate oscillating signal $S_{OSC\_PD}$ causes return to the low logic state of the first output signal $S_{OUT\_UP}$ (instant $u1_1$). The time interval $P_3$ substantially corresponds to the period of the intermediate reference signal $S_{REF\_PD}$.

To conclude all the possible cases, a possible rising edge of the intermediate reference signal $S_{REF\_PD}$ preceding the rising edge of the intermediate oscillating signal $S_{OSC\_PD}$ in the time interval considered causes a transition of logic state, from low to high, of the second output signal $S_{OUT\_DW}$; the subsequent transition of logic state, from low to high, of the intermediate oscillating signal $S_{OSC\_PD}$ causes transition from the high logic state to the low logic state of the second output signal $S_{OUT\_DW}$. This situation may be noted at instants $u_{13}$ and $u_{13}$, in the time interval $P_3$.

If we define the interval $u_1$-$u_2$ as $\Delta u_{F1}$, the interval $u_3$-$u_4$ as $\Delta t_{R1}$, the interval $u_5$-$u_6$ as $\Delta u_{F2}$, the interval $u_7$-$u_9$ as $\Delta u_{R2}$, the interval $u_{13}$-$u_{14}$ as $\Delta u_{F3}$, and the interval $u_{13}$-$u_{13}$ as $\Delta u_{R3}$, the difference between the period $T_{REF\_PD}$ of the intermediate reference signal $S_{REF\_PD}$ and the period $T_{OSC\_PD}$ of the intermediate oscillating signal $S_{OSC\_PD}$ (corresponding to the difference between the period $T_{REF}$ of the reference signal $S_{REF}$ and the period $T_{OSC}$ of the oscillating signal $S_{OSC}$) obeys the following relation (2):

$$\frac{(T_{REF} - T_{OSC})}{2} =$$

$$\frac{(T_{REF\_PD} - T_{OSC\_PD})}{2} = +\Delta u_{R1} - \Delta u_{F1} = +\Delta u_{R2} - \Delta u_{F2} = -\Delta u_{R3} + \Delta u_{F3}$$

From the examples of FIGS. 6A-6D and 7A-7D, some evaluations, which are of general validity, may be made. Following upon the instant $t_{RESET\_OFF}$, the phase-detector block 4 remains waiting for a rising edge or a falling edge of one between the intermediate reference signal $S_{REF\_PD}$ and the intermediate oscillating signal $S_{OSC\_PD}$. The first rising edge/falling edge acquired determines a corresponding variation of one of the output signals $S_{OUT\_UP}$ or $S_{OUT\_DW}$, on the basis of the rules described previously. Then, the phase-detector block 4 remains waiting for a subsequent rising edge/falling edge of one between the intermediate reference signal $S_{REF\_PD}$ and the intermediate oscillating signal $S_{OSC\_PD}$. The detection of said rising edge/falling edge determines a corresponding variation of one of the output signals $S_{OUT\_UP}$ and $S_{OUT\_DW}$, as described previously. The phase-detector block 4 remains in the acquisition state until it acquires, for both the intermediate reference signal $S_{REF\_PD}$ and the intermediate oscillating signal $S_{OSC\_PD}$, both a respective rising edge and a respective falling edge to generate the output signals $S_{OUT\_UP}$ and $S_{OUT\_DW}$. This condition defines the duration of each time interval of the detection step (i.e., of each of the time intervals previously identified as $T_1$-$T_3$ and $P_1$-$P_3$).

Acquisition of a rising edge of one between the intermediate reference signal $S_{REF\_PD}$ and the intermediate oscillating signal $S_{OSC\_PD}$ entails rejection of a subsequent rising edge of the same intermediate reference signal $S_{REF\_PD}$ or of the intermediate oscillation $S_{OSC\_PD}$ in the time interval considered. Likewise, acquisition of a falling edge of one between the intermediate reference signal $S_{REF\_PD}$ and the intermediate oscillating signal $S_{OSC\_PD}$ entails rejection of a subsequent falling edge of the same intermediate reference signal $S_{REF\_PD}$ or intermediate oscillating signal $S_{OSC\_PD}$, in the time interval considered.

When the condition of acquisition both of a rising edge and of a respective falling edge for both the intermediate reference signal $S_{REF\_PD}$ and the intermediate oscillating signal $S_{OSC\_PD}$ is verified, then the acquisition by the phase-detector block 4 can be considered concluded, and the time interval corresponding to said acquisition can terminate. With reference to the previous examples, in each time interval $T_1$-$T_3$ and $P_1$-$P_3$, these conditions are always verified. For instance, with reference to FIGS. 6A-6D, acquisition of the input signals by the phase-detector block 4 can be considered concluded at each of the instants $t_4$, $t_8$ and $t_{12}$, whereas, with reference to FIGS. 7A-7D, acquisition of the input signals by the phase-detector block 4 can be considered concluded at each of the instants $u_4$, $u_9$ and $u_{13}$.

It is here pointed out that, the condition of acquisition of a rising edge and a falling edge of the intermediate reference signal $S_{REF\_PD}$ and intermediate oscillating signal $S_{OSC\_PD}$ is obtained in a time substantially equal to, or shorter than, the longer between the periods $T_{REF\_PD}$ and $T_{OSC\_PD}$, i.e., substantially equal to, or shorter than, the longer between the periods $T_{REF}$ and $T_{OSC}$.

To return to FIG. 1, the information regarding the difference between the period $T_{REF}$ of the reference signal $S_{REF}$ and the period $T_{OSC}$ of the oscillating signal $S_{OSC}$, given by the aforementioned relations (1) and (2), can be detected as voltage across a capacitor 10. The capacitor 10 has a first terminal 10' and a second terminal 10''. The second terminal 10'' is coupled to reference voltage GND, for example, ground voltage.

The capacitor 10 can be charged and discharged by means of a charge pump 6. The charge pump 6 is of a type in itself known, and comprises a top current generator 6a (for example, a MOSFET) coupled between a voltage-supply terminal $V_{DD}$ and an intermediate node 6', and a bottom current generator 6b (for example, a MOSFET) coupled between the intermediate node 6' and the reference terminal GND, at reference voltage, for example, ground voltage. The intermediate node 6' can be coupled to the first terminal 10' of the capacitor 10.

The first output signal $S_{OUT\_UP}$ is used for activating/deactivating the top current generator 6a, whilst the second output signal $S_{OUT\_DW}$ is used for activating/deactivating the bottom current generator 6b.

In greater detail, according to one embodiment, the output 4e of the phase-detector block 4 is coupled to the control terminal (or gate terminal) of the transistor that provides the top current generator 6a. The first output signal $S_{OUT\_UP}$ is such that the high logic value "1" corresponds to a voltage value such as to activate the transistor 6a, which conducts current, thus charging the capacitor 10.

Likewise, the output 4f of the phase-detector block 4 is coupled to the control terminal (or gate terminal) of the transistor that provides the bottom current generator 6b. The second output signal $S_{OUT\_DW}$ is such that the high logic value "1" corresponds to a voltage value such as to activate the transistor 6b, thus discharging the capacitor 10.

It is here pointed out that, in the case where both of the output signals $S_{OUT\_UP}$ and $S_{OUT\_DW}$ have a high value "1", the supply terminal $V_{DD}$ is coupled to the reference terminal GND through the transistors 6a and 6b, which are both conducting. In this condition, the capacitor 10 does is not charged or discharged. Moreover, it is pointed out that this condition does not cause damage to the charge pump 6 in so far as the currents considered are of a low value.

Once again with reference to FIG. 1, the intermediate node 6' of the charge pump 6 can be coupled to the first terminal 10' of the capacitor 10 via a switch 8, controlled by the reset signal $S_{RESET}$. Moreover, a further switch 9 is configured for coupling and decoupling the first conduction terminal 10' of the capacitor 10 to/from a voltage terminal $V_{CM}$, for example, approximately equal to $V_{DD}/2$, for charging the capacitor 10 to a voltage having the function of threshold value, on the basis of which it is possible to detect an increase or a reduction of the charge stored by the capacitor 10 in use, on account of the operation described of the charge pump 6.

When the reset signal $S_{RESET}$ has a high value "1", the switch 8 is driven into an open state, i.e., the intermediate node 6' is decoupled from the first terminal 10' of the capacitor 10, whereas the switch 9 is driven into a closed state, i.e., the voltage terminal $V_{CM}$ is coupled to the first terminal 10' of the capacitor 10. In this condition, the output signals $S_{OUT\_UP}$ and $S_{OUT\_DW}$ do not cause any variation of charge on the capacitor 10.

Instead, when the reset signal $S_{RESET}$ has a low value "0", the switch 8 is driven into a closed state, i.e., the intermediate node 6' is coupled to the first terminal 10' of the capacitor 10, and the switch 9 is driven into an open state, i.e., the voltage terminal $V_{CM}$ is decoupled from the first terminal 10' of the capacitor 10. In this condition, the output signals $S_{OUT\_UP}$ and $S_{OUT\_DW}$ vary the charge on the capacitor 10 and the voltage across it, as discussed previously.

The information deriving from the voltage across the capacitor 10 can be used according to the need, in particular for acquiring information regarding the difference in period between the reference signals $S_{REF}$ and $S_{OSC}$. For instance, perfect synchronism between the reference signal $S_{REF}$ and the oscillating signal $S_{OSC}$ do not cause a variation of the determined threshold value $V_{CM}$. A reference signal $S_{REF}$ with period longer than the period of the oscillating signal $S_{OSC}$ causes an increase in the voltage across the capacitor 10 with respect to the threshold $V_{CM}$. A reference signal $S_{REF}$ with a period $T_{REF}$ shorter than the period $T_{OSC}$ of the oscillating signal $S_{OSC}$ causes a reduction of the voltage across the capacitor 10 with respect to the threshold $V_{CM}$. Hence, on the basis of the value measured across the capacitor 10 with respect to the defined threshold $V_{CM}$, it is possible to derive information regarding the frequency of the oscillating signal $S_{OSC}$, so as to increase or reduce the frequency thereof with purposes of fast calibration. In particular, the deviation of the voltage measured across the capacitor 10 with respect to the threshold $V_{CM}$ likewise indicates how much the period $T_{OSC}$ of the oscillating signal $S_{OSC}$ is longer/shorter than the period $T_{REF}$ of the reference signal $S_{REF}$. It is here pointed out that said information is acquired in a time interval equal to or shorter than the longer between the periods $T_{REF}$ and $T_{OSC}$. For a coarse calibration, for example, with testing purposes, the circuit and method according to the present disclosure may facilitate a comparison between the period $T_{OSC}$ of the oscillating signal $S_{OSC}$ and the period $T_{REF}$ of the reference signal $S_{REF}$ in a time that is, at the most, approximately equal to the longer between the periods $T_{REF}$ and $T_{OSC}$.

Figure 8:
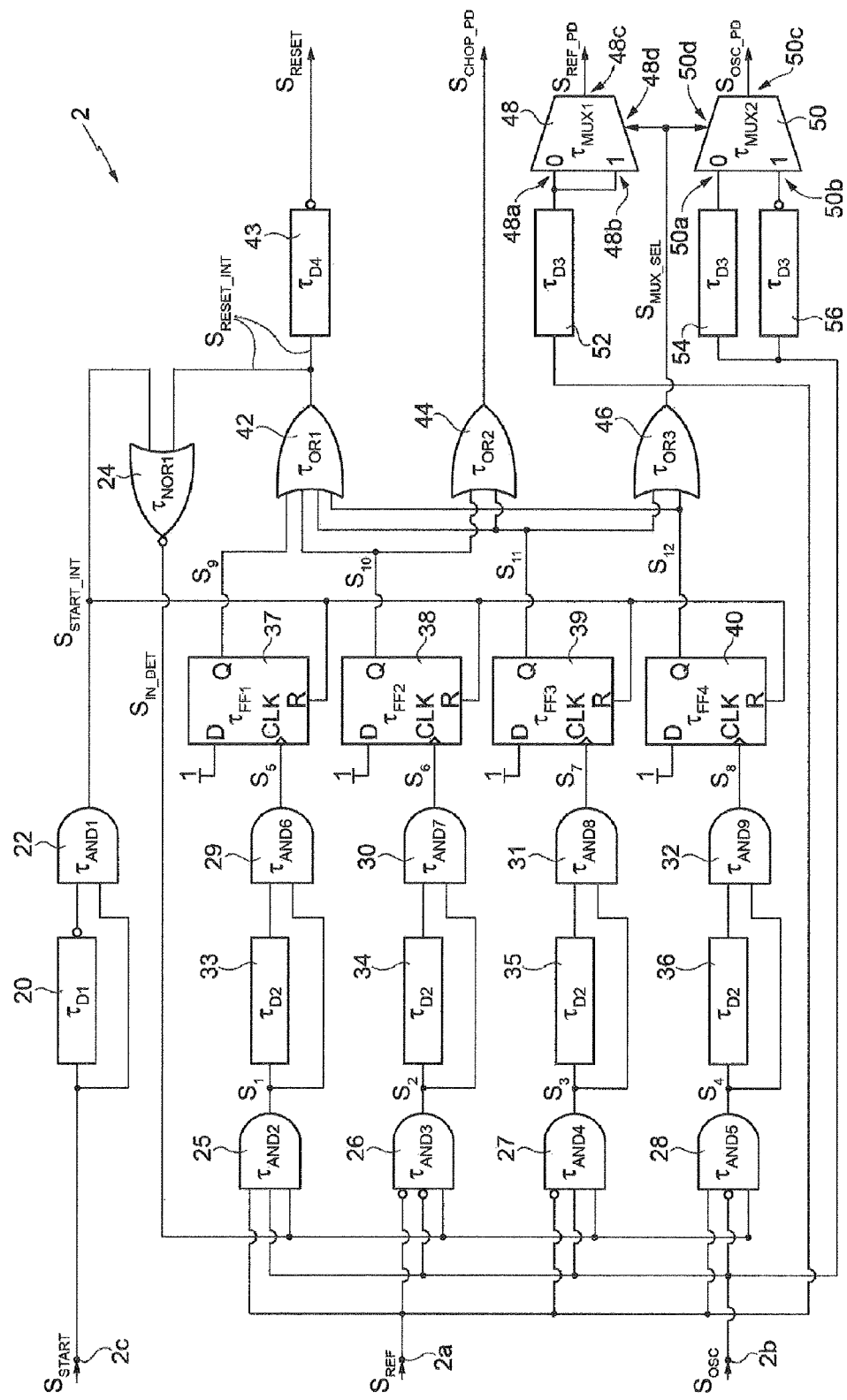
FIG. 8 shows a circuit implementation of an embodiment of the signal-conditioning module of FIG. 1.

FIG. 8 shows a circuit implementation of the phase-generator block 2, according to one embodiment.

The phase-generator block 2 comprises, coupled to the input 2c, an inverter 20 (or else a chain of inverters in odd number) and a logic gate 22 configured for carrying out an AND logic operation. The inverter 20 receives at input the enable signal $S_{START}$ and generates at output an inverted enable signal $/S_{START}$, introducing a delay $\tau_{D1}$. The logic gate 22 receives at input the inverted enable signal $/S_{START}$ and the enable signal $S_{START}$, and generates at output an intermediate enable signal $S_{START\_INT}$. Passage from the logic state "0" to the logic state "1" of the enable signal $S_{START}$ causes, after a delay $\tau_{AND1}$ equal to the delay of propagation introduced by the logic gate 22, passage from the logic state "0" to the logic state "1" of the intermediate enable signal $S_{START\_INT}$. The connection of the logic gates 20 and 22 is such that the intermediate enable signal $S_{START\_INT}$ remains equal to the logic value "1" for a time interval equal to $\tau_{D1}$, after which it will pass from the logic state "1" to the logic state "0". When the intermediate enable signal $S_{START\_INT}$ has the logic value "1", it causes reset of the flip-flops designated in FIG. 8 by the reference numbers from 37 to 40, and then sends the signals designated by $S_9$-$S_{12}$ to the logic state "0" (as better illustrated in what follows).

The intermediate enable signal $S_{START\_INT}$ is set at input to a logic gate 24, configured for carrying out an operation of logic NOR (negated OR). A second input of the logic gate 24 is picked up upstream of the output 2g of the phase-generator block 2, by picking up an intermediate reset signal $S_{RESET\_INT}$ correlated to the reset signal $S_{RESET}$. In particular, the reset signal $S_{RESET}$ is equal to the intermediate reset signal $S_{RESET\_INT}$ inverted and delayed by $\tau_{D4}$. The output of the logic gate 24 is the signal $S_{IN\_DET}$, which assumes the high logic value "1" when the inputs to the logic gate 24 are both at the low logic value "0", i.e., when the enable signal $S_{START\_INT}$ returns to the low value "0" (after the interval $\tau_1$) and the intermediate reset signal $S_{RESET\_INT}$ is at the low value "0".

The signal $S_{IN\_DET}$ is set at input to a plurality of (for example, four) logic gates 25-28, for enabling acquisition of the reference signal $S_{REF}$ and the oscillating signal $S_{OSC}$ present on the inputs 2a and 2b, respectively. The logic gates 25-28 are configured for carrying out an AND logic operation on the basis of three logic data that they receive at input.

In detail, the logic gate 25 receives at input the signal $S_{IN\_DET}$, the reference signal $S_{REF}$, and the oscillating signal $S_{OSC}$, and generates at output a signal $S_1$ having a high logic value "1" only when all three of these signals have a high logic value "1", introducing a delay $\tau_{AND2}$.

The logic gate 26 receives at input the signal $S_{IN\_DET}$, the reference signal $S_{REF}$ negated ($/S_{REF}$), and the oscillating signal $S_{OSC}$ negated ($/S_{OSC}$), and generates at output a signal $S_2$ having a high logic value "1" only when the signal $S_{IN\_DET}$ has a high value "1" and the reference signal $S_{REF}$ and the oscillating signal $S_{OSC}$ have a low logic value "0", introducing a delay $\tau_{AND3}$.

The logic gate 27 receives at input the signal $S_{IN\_DET}$, the reference signal $S_{REF}$ negated ($/S_{REF}$), and the oscillating signal $S_{OSC}$, and generates at output a signal $S_3$ having a high logic value "1" only when the signal $S_{IN\_DET}$ has a high value "1", the reference signal $S_{REF}$ has a low logic value "0", and the oscillating signal $S_{OSC}$ has a high logic value "1", introducing a delay $\tau_{AND4}$.

The logic gate 28 receives at input the signal $S_{IN\_DET}$, the reference signal $S_{REF}$, and the oscillating signal $S_{OSC}$ negated ($/S_{OSC}$), and generates at output a signal $S_4$ having a high logic value "1" only when the signal $S_{IN\_DET}$ has a high value "1", the reference signal $S_{REF}$ has a high logic value "1", and the oscillating signal $S_{OSC}$ has a low logic value "0", introducing a delay $\tau_{AND5}$. In particular, the time intervals $\tau_{AND2}$, $\tau_{AND3}$, $\tau_{AND4}$, and $\tau_{AND5}$ of the logic gates 25-28 have the same value as one another.

The phase-generator block 2 further comprises a plurality of (for example, four) logic gates 29-32, respectively configured for carrying out an AND logic operation. Each of the logic gates 29-32 has a first input coupled to the output of a respective logic gate 25-28 for receiving one of the signals $S_1$-$S_4$ and a second input configured for receiving a delayed copy of the signal $S_1$-$S_4$ that it receives on the first input. For this purpose, there is present a plurality of (for example, four) delay elements 33-36, for example formed by a chain of inverters of even number (e.g., two inverters).

In greater detail, the delay element 33 is coupled between the output of the logic gate 25 and the second input of the logic gate 29, and introduces on the signal $S_1$ a delay equal to $\tau_{D2}$; the first input of the logic gate 29 is instead directly coupled to the output of the logic gate 25, for receiving the signal $S_1$ not delayed. In use, then, the output of the logic gate 29 is a binary signal $S_5$ that has a variation from the low logic level "0" to the high logic level "1" only when the signal $S_1$ maintains the high logic value "1" for at least a time interval of $\tau_{D2}$; the rising edge of the binary signal $S_5$ has a delay equal to $\tau_{D2}$, plus the delay $\tau_{AND6}$ introduced by the logic gate 29, with respect to the respective rising edge of the signal $S_1$.

Likewise, the delay element 34 is coupled between the output of the logic gate 26 and the second input of the logic gate 30, and introduces on the signal $S_2$ a delay equal to $\tau_{D2}$; the first input of the logic gate 30 is instead directly coupled to the output of the logic gate 26, for receiving the signal $S_2$ not delayed. In use, then, the output of the logic gate 30 is a binary signal $S_6$ that has a variation from the low logic level "0" to the high logic level "1" only when the signal $S_2$ maintains the high logic value "1" for at least a time interval of $\tau_{D2}$; the rising edge of the signal $S_2$ has a delay equal to $\tau_{D2}$, plus the delay $\tau_{AND7}$ introduced by the logic gate 30, with respect to the respective rising edge of the signal $S_2$.

The delay element 35 is coupled between the output of the logic gate 27 and the second input of the logic gate 31, and introduces on the signal $S_3$ a delay equal to $\tau_{D2}$; the first input of the logic gate 31 is instead directly coupled to the output of the logic gate 27, for receiving the non-delayed signal $S_3$. In use, then, the output of the logic gate 31 is a binary signal $S_7$ that has a variation from the low logic level "0" to the high logic level "1" only when the signal $S_3$ maintains the high logic value "1" for at least a time interval of $\tau_{D2}$; the rising edge of the signal $S_3$ has a delay equal to $\tau_{D2}$, plus the delay $\tau_{AND8}$ introduced by the logic gate 31, with respect to the respective rising edge of the signal $S_3$.

The delay element 36 is coupled between the output of the logic gate 28 and the second input of the logic gate 32, and introduces on the signal $S_4$ a delay equal to $\tau_{D2}$; the first input of the logic gate 32 is instead directly coupled to the output of the logic gate 28, for receiving the non-delayed signal $S_4$. In use, then, the output of the logic gate 32 is a binary signal $S_8$ that has a variation from the low logic level "0" to the high logic level "1" only when the signal $S_4$ maintains the high logic value "1" for at least a time interval of $\tau_{D2}$; the rising edge of the binary signal $S_8$ has a delay equal to $\tau_{D2}$, plus the delay $\tau_{AND9}$ introduced by the logic gate 32, with respect to the respective rising edge of the signal $S_4$. In particular, the time intervals $\tau_{AND6}$, $\tau_{AND7}$, $\tau_{AND8}$ and $\tau_{AND9}$ of the logic gates 29-32 have the same value as one another.

The phase-generator block 2 further comprises a plurality of (for example, four) flip-flops 37-40 of a DQ type in themselves known. Each of the flip-flops 37-40 includes a reset input R, a clock input CLK, a data input D and a data output Q. The reset input R of each of the flip-flops 37-40 is coupled to the output of the logic gate 22 for receiving the intermediate enable signal $S_{START\_INT}$. Each flip-flop 37-40 is enabled when $S_{START\_INT}$ has a low logic value "0". Instead, when the intermediate enable signal $S_{START\_INT}$ has a high logic value "1", the signal $S_9$-$S_{12}$ present on the respective output of each flip-flop 37-40 is set to a predefined logic value, in particular the low logic value "0".

With reference to the flip-flop 37, at the rising edge of the signal $S_5$ fed to the clock input CLK, the input logic datum set on the input D is transferred onto the output Q (signal $S_9$), with a delay $\tau_{FF1}$. As illustrated, the input datum on the input D is fixed and is at the high logic value "1". Hence, at each rising edge of the signal $S_5$ (and with the intermediate enable signal $S_{START\_INT}$ at the low logic value), the flip-flop 37 generates at output the signal $S_9$ having a high logic value "1", delayed by $\tau_{FF1}$.

With reference to the flip-flop 38, at the rising edge of the signal $S_6$ supplied to the clock input CLK, the input logic datum set on the input D is transferred onto the output Q (signal $S_{10}$), with a delay $\tau_{FF2}$. As illustrated, the input datum on the input D is fixed and is at the high logic value "1". Hence, at each rising edge of the signal $S6$ (and with the intermediate enable signal $S_{START\_INT}$ at the low logic value), the flip-flop 38 generates at output the signal $S_{10}$ having a high logic value "1", delayed by $\tau_{FF2}$.

With reference to the flip-flop 39, at the rising edge of the signal $S_7$ supplied to the clock input CLK, the input logic datum set on the input D is transferred onto the output Q (signal $S_{11}$), with a delay $\tau_{FF3}$. As illustrated, the input datum on the input D is fixed and is at the high logic value "1". Hence, at each rising edge of the signal $S_7$ (and with the intermediate enable signal $S_{START\_INT}$ at the low logic value), the flip-flop 39 generates at output the signal $S_{11}$ having a high logic value "1", delayed by $\tau_{FF3}$.

With reference to the flip-flop 40, at the rising edge of the signal $S_8$ supplied to the clock input CLK, the input logic datum set on the input D is transferred onto the output Q (signal $S_{12}$), with a delay $\tau_{FF4}$. As illustrated, the input datum on the input D is fixed and is at the high logic value "1". Hence, at each rising edge of the signal $S_8$ (and with the intermediate enable signal $S_{START\_INT}$ at the low logic value), the flip-flop 40 generates at output the signal $S_{12}$ having a high logic value "1", delayed by $\tau_{FF4}$. The time intervals $\tau_{FF1}$, $\tau_{FF2}$, $\tau_{FF3}$, and $\tau_{FF4}$ of the flip-flops 37-40 have the same value as one another.

The signals $S_9$-$S_{12}$ generated at output from the respective flip-flops 37-40 are set at input to one and the same logic gate 42, configured for carrying out an OR logic operation on the signals $S_9$-$S_{12}$. The output of the logic gate 42 is the intermediate reset signal $S_{RESET\_INT}$ previously mentioned, and has a high logic value "1" when at least one of the signals $S_9$-$S_{12}$ has a high logic value "1". The logic gate 42 moreover introduces a delay equal to $\tau_{OR1}$. The intermediate reset signal $S_{RESET\_INT}$ is then set at input to an inverter 43 (or else a chain of inverters of odd number) configured for inverting the logic value of the intermediate reset signal $S_{RESET\_INT}$ to generate at output the reset signal $S_{RESET}$. The inverter 43 moreover introduces a delay between the input and the output equal to $\tau_{D4}$.

The phase-generator block 2 further comprises a further logic gate 44, configured for carrying out an OR logic operation, having an input coupled to the output of the flip-flop 38 and another input coupled to the output of the flip-flop 39, for receiving the signals $S_{10}$ and $S_{11}$, respectively. The output of the logic gate 44 supplies the control signal $S_{CHOP\_PD}$, which assumes the high logic value "1" only when at least one of the signals $S_{10}$ and $S_{11}$ has a high logic value "1", or else only when one of the two signals $S_2$ and $S_3$ has a high logic value "1", or else only when, after the instant $t_{START}$, the reference signal $S_{REF}$ maintains the low logic value "0" for at least a time interval of $\tau_{D2}$, irrespective of the logic value of the oscillating signal $S_{OSC}$ (provided, obviously, that the signal $S_{IN\_DET}$ has a high logic value "1", indicating enabling operation of the phase-generator block 2).

The phase-generator block 2 further comprises a logic gate 46, configured for carrying out an OR logic operation, having an input coupled to the output of the flip-flop 40 and another input coupled to the output of the flip-flop 39, for receiving the signals $S_{12}$ and $S_{11}$, respectively. The output of the logic gate 46 supplies a selection signal $S_{MUX\_SEL}$, which assumes the high logic value "1" only when one of the signals $S_{11}$ and $S_{12}$ has a high logic value "1".

The selection signal $S_{MUX\_SEL}$ has the function of controlling a first multiplexer 48 and a second multiplexer 50 that form part of the phase-generator block 2. The first multiplexer 48 has a first input 48a and a second input 48b, and an output 48c. Likewise, the second multiplexer 50 has first input 50a and a second input 50b, and an output 50c. The selection signal $S_{MUX\_SEL}$ is set on a respective selection input 40d and 50d of the first and second multiplexers 48 and 50. Each multiplexer 48, 50 is a multiplexer of a type in itself known and is configured in such a way that, when the selection signal $S_{MUX\_SEL}$ has a first logic value (e.g., the low logic value "0"), then the signal at output from the first and second multiplexers 48, 50 is the signal present at the respective first inputs 48a and 50a of the first and second multiplexers 48, 50, whereas, when the selection signal $S_{MUX\_SEL}$ has a second logic value opposite to the first logic value (e.g., the high logic value "1"), then the signal at output from the first and second multiplexers 48, 50 is the signal present at the respective second inputs 48b and 50b of the first and second multiplexers 48, 50. The signal at output from the first multiplexer 48 is the intermediate reference signal $S_{REF\_PD}$, and the signal at output from the second multiplexer 50 is the intermediate oscillating signal $S_{OSC\_PD}$.

In greater detail, as described previously, the intermediate reference signal $S_{REF\_PD}$ corresponds to the delayed reference signal $S_{REF}$. For this purpose, the reference signal $S_{REF}$ is supplied to both of the inputs 48a and 48b of the first multiplexer 48, delayed by a time interval $\tau_{D3}$ introduced by a delay element 52 (e.g., formed by an even number of inverters, not shown). In this way, irrespective of the value of the selection signal $S_{MUX\_SEL}$, the signal at output from the first multiplexer 48 (i.e., the intermediate reference signal $S_{REF\_PD}$) always corresponds to the reference signal $S_{REF}$ delayed by $\tau_{D3} + \tau_{MUX1}$ (where $\tau_{MUX1}$ is the delay introduced by the multiplexer 48).

As regards the intermediate oscillating signal $S_{OSC\_PD}$, this corresponds to the oscillating signal $S_{OSC}$ delayed only in the case where the reference signal $S_{REF}$ and the oscillating signal $S_{OSC}$ both maintain, after the instant $t_{START}$, the same logic value stable at the high value "1" or the low value "0" for at least a time interval of $\tau_{D2}$ (provided, obviously, that the signal $S_{IN\_DET}$ has a high logic value "1"); instead, in the case where the reference signal $S_{REF}$ and the oscillating signal $S_{OSC}$ maintain, after the instant $t_{START}$, logic values that are opposite and stable for at least a time interval of $\tau_{D2}$ (provided, obviously, that the signal $S_{IN\_DET}$ has a high logic value "1"), then the intermediate oscillating signal $S_{OSC\_PD}$ corresponds to the oscillating signal $S_{OSC}$ inverted and delayed by $\tau_{D3} + \tau_{MUX2}$ (with the delay $\tau_{MUX2}$ introduced by the multiplexer 50). In particular, the time delays $\tau_{MUX1}$ and $\tau_{MUX2}$ have the same value as one another. For this purpose, supplied to the first input 50a of the second multiplexer 50 is the oscillating signal $S_{OSC}$, delayed by an interval $\tau_{D3}$ introduced by a delay element 54 similar to the delay element 52, and supplied to the second input 50b of the second multiplexer 50 is the oscillating signal $S_{OSC}$, inverted and delayed by an interval $\tau_{D3}$. The delay $\tau_{D3}$ is in the latter case introduced by a delay and inversion element 56. By means of the selection signal $S_{MUX\_SEL}$, it is hence possible to define which between the signals present at the inputs 50a and 50b of the second multiplexer 50 is to be supplied on the output 50c of the second multiplexer 50. In particular, the second multiplexer 50 supplies at output the oscillating signal $S_{OSC}$, delayed and inverted only when the selection signal $S_{MUX\_SEL}$ has the logic value "1", or else, when at least one between the signals $S_{11}$ and $S_i$, has the logic value "1", or else, only when one among the signals $S_3$ and $S_4$ has maintained the logic value "1" for at least a time interval $\tau_{D2}$. This latter condition occurs in the case where the reference signal $S_{REF}$ and the oscillating signal $S_{OSC}$ have logic values opposite to one another and stable (i.e., they maintain a certain respective logic value, either high or low) for at least a time interval $\tau_{D2}$ after the instant $t_{START}$ (and, obviously, provided that the signal $S_{IN\_DET}$ has a high logic value "1", indicating the fact that the phase-generator block 2 is enabled for operation). In the remaining cases, namely, when the reference signal $S_{REF}$ and the oscillating signal $S_{OSC}$ have the same stable logic value (i.e., they maintain a certain respective high logic value or low logic value) for at least a time interval $\tau_{D2}$ after the instant $t_{START}$, the output of the logic gate 46, i.e., the selection signal $S_{MUX\_SEL}$, has the logic value "0", and the signal at output from the second multiplexer 50 is picked up on the first input 50a.

Figure 9:
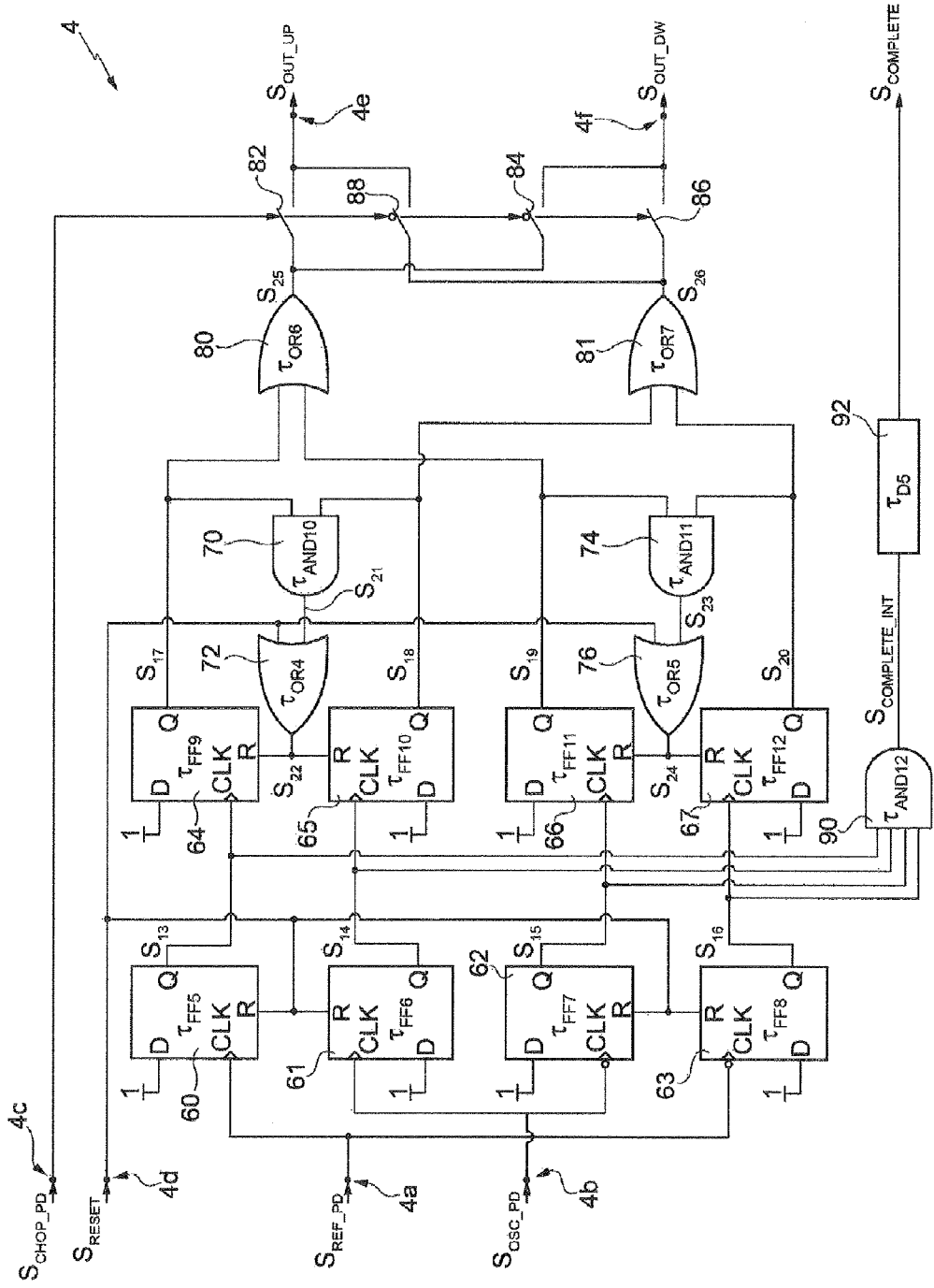
FIG. 9 shows a circuit implementation of an embodiment of the period-to-voltage converter module of FIG. 1.

FIG. 9 shows, according to one embodiment, a circuit implementation of the phase-detector block 4.

The phase-detector block 4 comprises a plurality of (as illustrated, four) flip-flops 60-63, of the DQ type, in themselves known. Each flip-flop 60-63 is coupled to one between the inputs 4a and 4b of the phase-detector block 4, for receiving a respective intermediate reference signal $S_{REF\_PD}$ and intermediate oscillating signal $S_{OSC\_PD}$.

Each of the flip-flops 60-63 includes a reset input R, a clock input CLK, a data input D and a data output Q. The reset input R of each of the flip-flops 60-63 is coupled to the input 4d for receiving the reset signal $S_{RESET}$. Each flip-flop 60-63 is enabled for operation when the reset signal $S_{RESET}$ has a low logic value "0". Instead, when the reset signal $S_{RESET}$ has a high logic value "1", the signal present on the respective output of each flip-flop 60-63 is set at a defined logic value, for example, the low logic value "0".

With reference to the flip-flop 60, at the rising edge of the intermediate reference signal $S_{REF\_PD}$, the input logic datum set on the input D is transferred onto the output Q (signal $S_{13}$), with a delay $\tau_{FF5}$. As illustrated, the input datum on the input D is fixed and is at the high logic value "1". Hence, at each rising edge of the intermediate reference signal $S_{REF\_PD}$ (and with the reset signal $S_{RESET}$ at the low logic value "0", the flip-flop 60 generates at output the signal $S_{13}$ having a high logic value "1" and the rising edge delayed by $\tau_{FF5}$ with respect to the rising edge of the intermediate reference signal $S_{REF\_PD}$.

With reference to the flip-flop 61, at the rising edge of the intermediate oscillating signal $S_{OSC\_PD}$, the logic datum supplied to the input D is transferred onto the output Q (signal $S_{14}$), with a delay $\tau_{FF6}$. As illustrated, the input datum on the input D is fixed and is at the high logic value "1". Hence, at each rising edge of the intermediate reference signal $S_{OSC\_PD}$ (and with the reset signal $S_{RESET}$ at the low logic value "0"), the flip-flop 61 generates at output the signal $S_{14}$ having a high logic value "1" and the rising edge delayed by $\tau_{FF6}$ with respect to the rising edge of the intermediate reference signal $S_{OSC\_PD}$.

With reference to the flip-flop 62, at the falling edge of the intermediate oscillating signal $S_{OSC\_PD}$ (i.e., at the rising edge of the inverted intermediate oscillating signal $S_{OSC\_PD}$) the logic datum supplied to the input D is transferred onto the output Q (signal $S_{15}$), with a delay $\tau_{FF7}$. As illustrated, the input datum on the input D is fixed and is at the high logic value "1". Hence, at each falling edge of the intermediate reference signal $S_{OSC\_PD}$ (and with the reset signal $S_{RESET}$ at the low logic value "0"), the flip-flop 62 generates at output the signal $S_{15}$ having a high logic value "1" and the rising edge delayed by $\tau_{FF7}$ with respect to the rising edge of the inverted intermediate reference signal $S_{OSC\_PD}$. The inverted intermediate oscillating signal $S_{OSC\_PD}$ is generated by means of an inverter coupled between the input 4b of the phase-detector block 4 and the input CLK of the flip-flop 62.

With reference to the flip-flop 63, at the falling edge of the intermediate reference signal $S_{REF\_PD}$ (i.e., at the rising edge of the inverted intermediate reference signal $S_{REF\_PD}$) the logic datum supplied to the input D is transferred onto the output Q (signal $S_{16}$), with a delay $\tau_{FF8}$. As illustrated, the input datum on the input D is fixed and is at the high logic value "1". Hence, at each falling edge of the intermediate reference signal $S_{REF\_PD}$ (and with the reset signal $S_{RESET}$ at the low logic value "0"), the flip-flop 63 generates at output the signal $S_{16}$ having a high logic value "1" and the rising edge delayed by $\tau_{FF8}$ with respect to the rising edge of the inverted intermediate reference signal $\overline{S_{REF\_PD}}$. The inverted intermediate reference signal $\overline{S_{REF\_PD}}$ is generated by means of an inverter coupled between the input 4a of the phase-detector block 4 and the input CLK of the flip-flop 63. The time delays $\tau_{FF5}$, $\tau_{FF6}$, $\tau_{FF7}$, and $\tau_{FF8}$ introduced by the flip-flops 60-63 have the same value as one another.

The phase-detector block 4 further comprises a plurality of (as illustrated, four) flip-flops 64-67, of the DQ type, in themselves known. Each flip-flop 64-67 is coupled to a respective output port Q of a respective flip-flop 60-63, for receiving a respective signal $S_{13}$-$S_{16}$.

Each of the flip-flops 64-67 includes a reset input R, a clock input CLK, a data input D, and a data output Q.

With reference to the flip-flop 64, the signal $S_{13}$ generated by the flip-flop 60 is supplied to the clock input CLK; at the rising edge of the signal $S_{13}$, the input logic datum set on the input D is transferred onto the output Q (signal $S_{17}$), with a delay $\tau_{FF9}$. As illustrated, the input datum on the input D is fixed and is at the high logic value "1". Hence, at each rising edge of the signal $S_{13}$ (and with the reset signal $S_{RESET}$ at the low logic value "0"), the flip-flop 64 generates at output the signal $S_{17}$ having a high logic value "1" and the rising edge delayed by $\tau_{FF9}$ with respect to the rising edge of the signal $S_{13}$.

With reference to the flip-flop 65, the signal $S_{14}$ generated by the flip-flop 61 is supplied to the clock input CLK; at the rising edge of the signal $S_{14}$, the input logic datum set on the input D is transferred onto the output Q (signal $S_{18}$), with a delay $\tau_{FF10}$. As illustrated, the input datum on the input D is fixed and is at the high logic value "1". Hence, at each rising edge of the signal $S_{14}$ (and with the reset signal $S_{RESET}$ at the low logic value "0"), the flip-flop 65 generates at output the signal $S_{18}$ having a high logic value "1" and the rising edge delayed by $\tau_{FF10}$ with respect to the rising edge of the signal $S_{14}$.

As may be noted from FIG. 9, the aforementioned signals $S_{17}$ and $S_{18}$ are supplied at input to a logic gate 70, configured for carrying out an AND logic operation on the signals $S_{17}$ and $S_{18}$. In particular, the output of the logic gate 70 is a signal $S_{21}$ that assumes a high logic value "1" only when both of the signals $S_{17}$ and $S_{18}$ have a high logic value "1". A further logic gate 72, configured for carrying out an OR logic operation, receives at input the signal $S_{21}$ and the reset signal $S_{RESET}$, and generates at output a signal $S_{22}$ having a high logic value "1" when at least one between the signal $S_{21}$ and the reset signal $S_{RESET}$ has a high logic value "1". In this operating situation, the output Q of the flip-flops 64 and 65 is forced to a predefined value, in this case the low logic value "0".

It should moreover be noted that the signals $S_{17}$ and $S_{18}$ assume the high logic value "1" when the signals $S_{13}$ and $S_{14}$ assume the high logic value "1" (with the delays generated by the known operation of the flip-flops 64 and 65). In turn, the signals $S_{13}$ and $S_{14}$ assume the high logic value "1" when the intermediate reference signal $S_{REF\_PD}$ and the intermediate oscillating signal $S_{OSC\_PD}$ assume the high logic value "1" (with the delays generated by the known operation of the flip-flops 60 and 61).

The operation so far described of the flip-flops 60, 61, 64 and 65 underlies the generation of the output signals $S_{OUT\_UP}$ and $S_{OUT\_DW}$ when their rising edge is controlled by the rising edge of one between the intermediate reference signal $S_{REF\_PD}$ and the intermediate oscillating signal $S_{OSC\_PD}$, and their falling edge is controlled by the subsequent rising edge of the other between the intermediate reference signal $S_{REF\_PD}$ and the intermediate oscillating signal $S_{OSC\_PD}$.

With reference to the flip-flop 66, the signal $S_{15}$ generated by the flip-flop 62 is supplied to the clock input CLK; at the rising edge of the signal $S_{15}$, the input logic datum set on the input D is transferred onto the output Q (signal $S_{19}$), with a delay $\tau_{FF11}$. As illustrated, the input datum on the input D is fixed and is at the high logic value "1". Hence, at each rising edge of the signal $S_{15}$ (and with the reset signal $S_{RESET}$ at the low logic value "0"), the flip-flop 66 generates at output the signal $S_{19}$ having a high logic value "1" and the rising edge delayed by $\tau_{FF11}$ with respect to the rising edge of the signal $S_{15}$.

With reference to the flip-flop 67, the signal $S_{16}$ generated by the flip-flop 63 is supplied to the clock input CLK; at the rising edge of the signal $S_{16}$, the input logic datum set on the input D is transferred onto the output Q (signal $S_{20}$), with a delay $\tau_{FF12}$. As illustrated, the input datum on the input D is fixed and is at the high logic value "1". Hence, at each rising edge of the signal $S_{16}$ (and with the reset signal $S_{RESET}$ at the low logic value "0", the flip-flop 67 generates at output the signal $S_{20}$ having a high logic value "1" and the rising edge delayed by $\tau_{FF12}$ with respect to the rising edge of the signal $S_{16}$. The time delays $\tau_{FF9}$, $\tau_{FF10}$, $\tau_{FF11}$, and $\tau_{FF12}$ introduced by the flip-flops 64-67 have the same value as one another.

As may be noted from FIG. 9, the aforementioned signals $S_{19}$ and $S_{20}$ are supplied at input to a logic gate 74, configured for carrying out an AND logic operation on the signals $S_{19}$ and $S_{20}$. In particular, the output of the logic gate 74 is a signal $S_{23}$ that assumes the high logic value "1" only when both of the signals $S_{19}$ and $S_{20}$ have a high logic value "1". A further logic gate 76, configured for carrying out an OR logic operation, receives at input the signal $S_{23}$ and the reset signal $S_{RESET}$, and generates at output a signal $S_{24}$ having a high logic value "1" when at least one between the signal $S_{23}$ and the reset signal $S_{RESET}$ has a high logic value "1". In this operating situation, the output Q of the flip-flops 66 and 67 is forced to a predefined value, in this case the low logic value "0".

It should moreover be noted that the signals $S_{19}$ and $S_{20}$ assume the high logic value "1" when the signals $S_{15}$ and $S_{16}$ assume the high logic value "1" (with the delays generated by the known operation of the flip-flops 66 and 67). In turn, the signals $S_{15}$ and $S_{16}$ assume the high logic value "1" when the intermediate reference signal $S_{REF\_PD}$ and intermediate oscillating signal $S_{OSC\_PD}$ assume the low logic value "0" (with the delays generated by the known operation of the flip-flops 62 and 63).

The operation so far described of the flip-flops 62, 63, 66 and 67 underlies the generation of the output signals $S_{OUT\_UP}$ and $S_{OUT\_DW}$ when their rising edge is controlled by the falling edge of one between the intermediate reference signal $S_{REF\_PD}$ and the intermediate oscillating signal $S_{OSC\_PD}$, and their falling edge is controlled by the subsequent falling edge of the other between the intermediate reference signal $S_{REF\_PD}$ and the intermediate oscillating signal $S_{OSC\_PD}$.

The phase-detector block 4 further comprises additional logic gates 80 and 81, configured for carrying out a respective OR logic operation. The logic gate 80 receives at input the signals $S_{17}$ and $S_{19}$ and generates an output signal $S_{25}$ having a high logic value "1" when at least one between the signals $S_{17}$ and $S_{19}$ has a high logic value "1". The logic gate 81 receives at input the signals $S_{18}$ and $S_{20}$ and generates an output signal $S_{26}$ having a high logic value "1" when at least one between the signals $S_{18}$ and $S_{20}$ has a high logic value "1".

The phase-generator block 4 further comprises a first output switch 82 coupled between the output of the logic gate 80 and the output 4e of the phase-generator block 4, and a second output switch 84 coupled between the output of the logic gate 80 and the output 4f of the phase-generator block 4.

The control signal $S_{CHOP\_PD}$ controls in opening and closing the first output switch 82 and the second output switch 84. In particular, the first and second output switches 82, 84 are configured in such a way that, when one of them is driven into a closed state (conduction), the other is driven into an open state (inhibition). For instance, the first switch 82 is an n-channel MOSFET, and the control signal $S_{CHOP\_PD}$ is supplied to the gate terminal of said transistor so that, when the control signal $S_{CHOP\_PD}$ assumes the high logic value "1", the gate terminal is biased so as to generate the conductive channel of the MOSFET 82, thus enabling conduction of electric current. The signal $S_{25}$ is thus supplied on the output 4e of the phase-generator block 4, to form the first output signal $S_{OUT\_UP}$. Vice versa, when the control signal $S_{CHOP\_PD}$ assumes the low logic value "0", the first switch 82 does not conduct electric current.

Consequently, in this example, the second switch 84 is a p-channel MOSFET, and the control signal $S_{CHOP\_PD}$ is supplied on the gate terminal of said transistor so that, when the control signal $S_{CHOP\_PD}$ assumes the low logic value "0", the gate terminal of the MOSFET 84 is biased so as to generate the conductive channel of the MOSFET 84, thus enabling conduction of electric current. The signal $S_{25}$ is thus supplied on the output 4f of the phase-generator block 4, to form the second output signal $S_{OUT\_DW}$. Vice versa, when the control signal $S_{CHOP\_PD}$ assumes the high logic value "1", the second switch 84 does not conduct electric current.

It is evident that the first and second switches 82 and 84 may be obtained with a technology different from MOSFET technology, according to the need.

The phase-generator block 4 further comprises a third output switch 86 coupled between the output of the logic gate 81 and the output 4f of the phase-generator block 4, and a fourth output switch 88 coupled between the output of the logic gate 81 and the output 4e of the phase-generator block 4.

The control signal $S_{CHOP\_PD}$ controls in opening and closing the third output switch 86 and the fourth output switch 88. In particular, the third and fourth output switches 86, 88 are configured in such a way that, when one of them is driven into a closed state (conduction), the other is driven into an open state (inhibition). For instance, the third switch 86 is an n-channel MOSFET, and the control signal $S_{CHOP\_PD}$ is supplied on the gate terminal of said transistor so that, when the control signal $S_{CHOP\_PD}$ assumes the high logic value "1", the gate terminal is biased so as to generate the conductive channel of the MOSFET 86, thus enabling conduction of electric current. The signal $S_{26}$ is thus supplied on the output 4f of the phase-generator block 4, to form the first output signal $S_{OUT\_DW}$. Vice versa, when the control signal $S_{CHOP\_PD}$ assumes the low logic value "0", the third switch 86 does not conduct electric current.

Consequently, in this example, the fourth switch 88 is a p-channel MOSFET, and the control signal $S_{CHOP\_PD}$ is supplied on the gate terminal of said transistor 88 so that, when the control signal $S_{CHOP\_PD}$ assumes the low logic value "0", the gate terminal of the MOSFET 88 is biased so as to generate the conductive channel of the MOSFET 88, thus enabling conduction of electric current. The signal $S_{26}$ is thus supplied on the output 4e of the phase-generator block 4, to form the second output signal $S_{OUT\_UP}$. Vice versa, when the control signal $S_{CHOP\_PD}$ assumes the high logic value "1", the fourth switch 88 does not conduct electric current.

It is evident that the third and fourth switches 86 and 88 may be obtained with a technology different from MOSFET technology, according to the need.

In any case, irrespective of the embodiment of the switches 82-88, when the control signal $S_{CHOP\_PD}$ assumes a first logic value (here, the high logic value "1"), the first and third output switches 82, 86 are driven into a closed state, supplying on the output 4e the signal $S_{25}$ and, respectively, on the output 4f the signal $S_{26}$ generated as described previously. Instead, when the control signal $S_{CHOP\_PD}$ assumes a second logic value (here, the low logic value "0") opposite to the first logic value, the second and fourth output switches 84, 88 are driven into a closed state, supplying on the output 4e the signal $S_{26}$ and, respectively, on the output 4f the signal $S_{25}$ generated as described previously.

The phase-generator block 4 further comprises a logic gate 90, configured for carrying out an AND logic operation on the signals $S_{13}$-$S_{16}$ and generating at output an intermediate end-of-operation signal $S_{COMPLETE\_INT}$ having a high logic value "1" only when all the signals $S_{13}$-$S_{16}$ have a high logic value "1". Coupled to the output of the logic gate 90 a delay element 92 is present, having the function of introducing a delay equal to $\tau_{D5}$ on the intermediate end-of-operation signal $S_{COMPLETE\_INT}$, to generate the end-of-operation signal $S_{COMPLETE}$.

FIGS. 10A-10J show, using one and the same time scale, the enable signal $S_{START}$, the intermediate enable signal $S_{IN\_DET}$, the reference signal $S_{REF}$, and the oscillating signal $S_{OSC}$, the selection signal $S_{MUX\_SEL}$, the reset signal $S_{RESET}$, the intermediate reference signal $S_{REF\_INT}$ and the intermediate oscillating signal $S_{OSC\_INT}$, and the first and second output signals $S_{OUT\_UP}$, $S_{OUT\_DW}$.

In this example, the enable signal $S_{START}$, the reference signal $S_{REF}$ and the oscillating signal $S_{OSC}$, the reset signal $S_{RESET}$, and the intermediate reference signal $S_{REF\_INT}$ and intermediate oscillating signal $S_{OSC\_INT}$, at the instant when the rising edge of the signal $S_{START}$ occurs, i.e., at the moment where the frequency-comparison process starts, have the same logic levels as the respective signals illustrated in FIGS. 5A-5G. However, FIGS. 10G and 10H show a possible plot of the reference signal $S_{REF}$ and oscillating signal $S_{OSC}$, and of the consequent intermediate reference signal $S_{REF\_PD}$ and intermediate oscillating signal $S_{OSC\_PD}$, in the case where the signals $S_{REF}$ and $S_{OSC}$ assume a logic value that is, respectively, high "1" and low "0" for a period of time shorter than the time interval $\tau_{D2}$.

Figure 10:
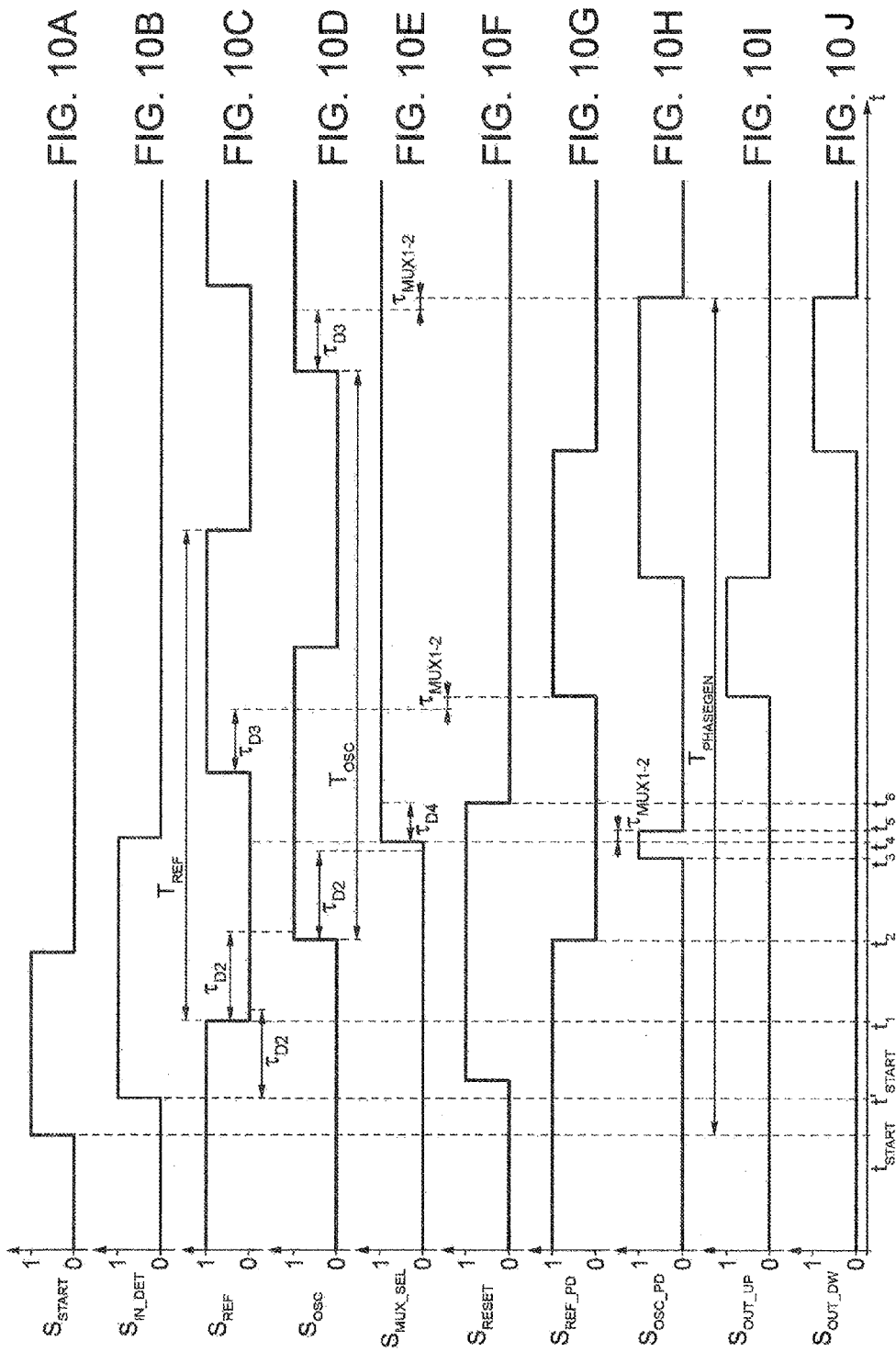
FIGS. 10A-10J show, using a common time scale, input signals, output signals, and intermediate operating signals of the signal-conditioning and period-to-voltage converter modules of FIG. 1.

As may be noted from FIG. 10A, at time $t_{START}$ the enable signal $S_{START}$ passes from the low logic level "0" to the high logic level "1". The intermediate enable signal $S_{IN\_DET}$ (FIG. 10B) follows the enable signal $S_{START}$ with a certain delay introduced by the delay block 20 ($\tau_{D1}$), by the logic gate 22 ($\tau_{AND1}$), and by the logic gate 24 ($\tau_{NOR1}$). The rising edge of the intermediate enable signal $S_{IN\_DET}$ is at time $t_{START}'$ equal to $t_{START}+\tau_{D1}+\tau_{AND1}+\tau_{NOR1}$.

The reset signal $S_{RESET}$ goes to the high logic value "1" after a time interval given by $$\tau_{AND1}+\tau_{RESET\_FF1-4}+\tau_{OR1}+\tau_{D4}$$

where $\tau_{RESET\_FF1-4}$ is the time interval that elapses from the instant where the reset input "R" of the flip-flops 37-40 (i.e., $S_{START\_INT}$) passes from the low logic value "0" to the high logic value "1" to the instant where the respective output signal of the flip-flops 37-40 themselves (i.e., the signals $S_9$-$S_{12}$) passes from the high logic value "1" to the low logic value "0".

As may be noted from FIG. 10C, the first falling edge, after $t_{START}$, of the Reference signal $S_{REF}$ occurs at time $t_1$. However, in this example, $t_1$ precedes in time $t_{START}{}^1+\tau_{D2}$. This means that the condition of stability of the intermediate reference signal $S_{REF\_PD}$ and intermediate oscillating signal $S_{OSC\_PD}$ is not satisfied. As described previously, in fact, the intermediate reference signal $S_{REF\_PD}$ and intermediate oscillating signal $S_{OSC\_PD}$ are considered stable when the reference signal $S_{REF}$ and the oscillating signal $S_{OSC}$ do not change their logic level for a determined length of time (e.g., one hundred or a few hundreds of picoseconds). According to the embodiment described of the phase-generator block 2, said determined length of time is equal to $\tau_{D2}$, i.e., equal to the delay introduced by the delay elements 33-36.

It is then necessary to wait again for both the reference signal $S_{REF}$ and the oscillating signal $S_{OSC}$ to maintain a logic level that is stable for a new time interval equal to $\tau_{D2}$, monitored starting from $t_1$. As may be noted from FIG. 10D, the oscillating signal $S_{OSC}$ changes its logic level, passing from the low logic level "0" to the high logic level "1" at the instant $t_2$, preceding $t_1+\tau_{D2}$. Since the condition of stability of the reference signal $S_{REF}$ and the oscillating signal $S_{OSC}$ is not yet satisfied, the reset signal $S_{RESET}$ is maintained at the high logic level "1". In this way, the variation of the intermediate reference signal $S_{REF\_PD}$, which follows the reference signal $S_{REF}$ with the delay introduced by the delay element 52 and by the multiplexer 48, does not produce any effect on the output signals $S_{OUT\_UP}$ and $S_{OUT\_DW}$.

With reference to FIGS. 10C and 10D, after the instant $t_2$, on the reference signal $S_{REF}$ and the oscillating signal $S_{OSC}$ there will arise a situation where said signals are stable. Otherwise, it would mean that one between the reference signal $S_{REF}$ and the oscillating signal $S_{OSC}$ has a frequency higher than the maximum detectable frequency. In fact, in FIGS. 10C and 10D, it happens that the reference signal $S_{REF}$ and the oscillating signal $S_{OSC}$ remain stable at the respective logic levels for an interval equal (and in particular longer) than $\tau_{D2}$, monitored starting from $t_2$. The condition of stability is now verified, with $S_{REF}$ stable at "0" and $S_{OSC}$ stable at "1", and the reset signal $S_{RESET}$ passes from the high value "1" to the low value "0". In this example, the selection signal $S_{MUX\_SEL}$ assumes the high logic value "1" (instant $t_4$) since the condition of stability has been detected when the reference signal $S_{REF}$ and oscillating signal $S_{OSC}$ had, respectively, a low logic value "0" and a high logic value "1". As may be noted from FIG. 10H, the intermediate oscillating signal $S_{OSC\_PD}$ has a rising edge at time $t_3$, caused by the rising edge of the oscillating signal $S_{OSC}$ at time $t_2$. However, the rising edge of the selection signal $S_{MUX\_SEL}$ at time $t_4$ causes (after a delay introduced by the multiplexer 50) falling of the intermediate oscillating signal $S_{OSC\_PD}$ at the instant $t_5$ (equaling, that is, the value present on the input 50b of the multiplexer 50). Also in this case, given that the reset signal $S_{RESET}$ is active (high logic level), these undesirable variations of the intermediate oscillating signal $S_{OSC\_PD}$ do not have any impact on the output signals $S_{OUT\_DP}$ and $S_{OUT\_DW}$.

At instant $t_6$, the reset signal $S_{RESET}$ returns to the low logic value "0". From this instant on, the variations of the intermediate reference signal $S_{REF\_PD}$ and intermediate oscillating signal $S_{OSC\_PD}$ are acquired and processed by the phase-detector block 4, as already described previously (and not described again here).

The embodiment of FIGS. 10A-10J represents the limit case where the time interval, necessary for obtaining output signals $S_{OUT\_UP}$ and $S_{OUT\_DW}$ to be used for detecting an indication of difference in period $T_{REF}$-$T_{OSC}$ between the reference signal $S_{REF}$ and the oscillating signal $S_{OSC}$, is maximum. In this case said interval is given by $$\tau_{PHASEGEN(MAX)}=\max(T_{REF},T_{OSC})+\tau_{D1}+2\tau_{D2}+\tau_{D3}+\tau_{AND1}+\tau_{NOR1}+\tau_{MUX1\text{-}2} \quad (3)$$

where: $\tau_{D1}$ is the delay introduced by the delay element 20, e.g., approximately 100 ps; $\tau_{D2}$ is the delay introduced by each of the delay elements 33-36, e.g., approximately 500 ps; $\tau_{D3}$ is the delay introduced by each of the delay elements 52-56, e.g., approximately 400 ps; $\tau_{AND1}$ is the delay introduced by the logic gate 22, e.g., approximately 100 ps; $\tau_{NOR1}$ is the delay introduced by the logic gate 24, e.g., approximately 100 ps; $\tau_{MUX1\text{-}2}$ is the delay introduced by the multiplexer 48 ($\tau_{MUX1}$) or by the multiplexer 50 ($\tau_{MUX2}$), which are assumed identical, e.g., approximately 100 ps.

With reference to the embodiments of the phase-generator block 2 and phase-detector block 4 of FIGS. 8 and 9, the delays introduced by the circuit elements described may be designed in such a way as to optimize operation of the respective circuits. Selection of the delays is not, however, critical for operation of the respective circuits, and limits only the maximum acceptable frequency of the reference signal $S_{REF}$ and oscillating signal $S_{OSC}$.

In an embodiment, the delay $\tau_{D1}$ of the delay block 20 is such that $$\tau_{D1}>\tau_{RES(FF1\text{-}4)}+\tau_{NOR1} \quad (4)$$

where $\tau_{RES(FF1\text{-}4)}$ is the delay introduced by each of the flip-flops 37-40 for resetting to a predefined value ("0") the output signal on the port Q when the reset signal $S_{RESET}$ set on the reset input R assumes the high logic value "1";

the delay $\tau_{MUX1\text{-}2}$ of each of the multiplexers 48 and 50 is such that $$\tau_{MUX1\text{-}2}<\tau_{D4}<\tau_{D3}+\tau_{MUX1\text{-}2}-\tau_{AND2\text{-}5}-\tau_{AND6\text{-}9}-\tau_{CLK,Q}$$
$$(FF1\text{-}4)-\tau_{OR1\text{-}3}<\tau_{D2} \quad (5)$$

where: $\tau_{CLK,Q(FF1\text{-}4)}$ is the delay introduced by each of the flip-flops 37-40 for supplying a respective output signal on the port Q when the respective signal set on the clock input CLK assumes the high logic value "1"; $\tau_{OR1\text{-}3}$ is the delay introduced by each respective logic gate 42 ($\tau_{OR1}$), 44 ($\tau_{OR2}$) and 46 ($\tau_{OR3}$), assumed identical; $\tau_{AND2\text{-}5}$ and $\tau_{AND6\text{-}9}$ are the delays introduced by the respective logic gates 25-28 and 29-32; and $\tau_{D4}$ is the delay introduced by the delay element 43; and the maximum frequency $f_{REF}$, $f_{OSC}$ of each between the reference signal $S_{REF}$ and oscillating signal $S_{OSC}$, respectively, is such that $$\max(f_{REF},f_{OSC})<1/(4\tau_{D2}) \quad (6)$$

FIG. 11 shows, by means of a block diagram, a calibration circuit or system 100 comprising the time-to-voltage converter circuit 1 of FIG. 1 coupled to a control logic 101 by means of a first comparator 104 and a second comparator 106. In greater detail, the first comparator 104 includes an inverting input coupled to a first threshold-reference terminal 108, for receiving a reference voltage $V_H$, and the second comparator 106 includes an non-inverting input coupled to a second threshold-reference terminal 110, for receiving a reference voltage $V_L$ lower than $V_H$. Both of the comparators 104, 106 include a respective terminal, respectively a non-inverting one and an inverting one, coupled to the terminal 10' of the capacitor 10 (FIG. 1), the voltage value of which is proportional to the difference between the period of the reference signal $S_{REF}$ and the period of the oscillating signal $S_{OSC}$ (in general hereinafter referred to as charge-pump signal $S_{CP}$).

Each of the comparators 104, 106 carries out an operation of comparison between the charge-pump signal $S_{CP}$ and the respective threshold-reference value $V_H$ or $V_L$, and generates a respective output signal $V_{COMP\_H}$ and $V_{COMP\_L}$ indicating the voltage value of the charge-pump signal $S_{CP}$. For instance, $V_{COMP\_H}$ has a first value (e.g., a high logic value "1") if $S_{CP} > V_H$, and a second value (e.g., a low logic value "0") if $S_{CP} < V_H$. Likewise, $V_{COMP\_L}$ has a first value (e.g., a high logic value "1") if $S_{CP} < V_L$, and a second value (e.g., a low logic value "0") if $S_{CP} > V_L$.

On the basis of the value assumed by $V_{COMP\_H}$ and $V_{COMP\_L}$, the control logic 101 is able to compare the frequency of the reference signal $S_{REF}$ with the frequency of the oscillating signal $S_{OSC}$.

According to an embodiment, it is possible to use a single comparator having a number of comparison levels, or else a single comparator with a single comparison level.

FIG. 11 shows the calibration system 100 coupled to a digitally controlled oscillator (DCO) 112, in a way in itself known. The control logic 101, on the basis of the reference signal $S_{REF}$ and the oscillating signal $S_{OSC}$, is configured for controlling the DCO in such a way as to reduce, increase, or keep unaltered the oscillation frequency of the latter on the basis of the value detected of the charge-pump signal $S_{CP}$. Control of the DCO by the control logic 101 is carried out in a way in itself known.

The control logic 101 is moreover configured for generating the enable signal $S_{START}$ and for receiving the signal $S_{COMPLETE}$.

In detail, the control logic 101 issues a command to the comparison circuit 1 for start of the process of comparison between the frequency of the reference signal $S_{REF}$ and the frequency of the oscillating signal $S_{OSC}$, generating a rising edge from the low logic level "0" to the high logic level "1" in the enable signal $S_{START}$. Next, the comparison circuit 1 generates a rising edge from the low logic level "0" to the high logic level "1" in the signal $S_{COMPLETE}$ at the instant when the comparison is completed and the result has already been generated by the blocks 104 and 106 and is stable on $V_{COMP\_H}$ and $V_{COMP\_L}$. Then, at this rising edge of the signal $S_{COMPLETE}$, the control logic 101 is configured for reading on the nodes $V_{COMP\_H}$ and $V_{COMP\_L}$ the result of the comparison for which the command was previously issued. In this way, the operations of trimming of the DCO are carried out only at the end of the operations of the time-to-voltage converter circuit 1.

The reference signal $S_{REF}$, having a reference frequency $f_{REF}$, is supplied by an oscillator circuit of a type in itself known, having a determined frequency or a frequency trimmable according to the need.

With reference once again to the delays introduced by the circuit elements of the phase-generator block 2 and by the phase-detector block 4, it is to be noted that, the delay $\tau_{D5}$ introduced on the end-of-operation signal $S_{COMPLETE}$ by the delay element 92 may be chosen of a temporal value such that $$\tau_{D5} > \tau_{PHASEDET} - \tau_{CLK,Q(FF5-8)} - \tau_{AND12} + \tau_{CP} + \tau_{COMP} \quad (7)$$

With reference to (7), it should be noted that:
$\tau_{PHASEDET}$ is the delay introduced by the circuit of FIG. 9 (due to propagation of the signals $S_{REF\_PD}$ and $S_{OSC\_PD}$ from the respective inputs 4a, 4b to the outputs 4e, 4f, where the signals $S_{OUT\_UP}$ and $S_{OUT\_DW}$ are supplied; said delay is caused by operation of the flip-flops 60-63 added to the delay generated by the flip-flops 64-67 and by the logic gates 80 and 81);
$\tau_{CLK,Q(FF5-8)}$ is the delay introduced by each of the flip-flops 60-63 of the phase-detector block 4;

$\tau_{AND12}$ is the delay introduced by the logic gate 90;
$\tau_{CP}$ is the response time of the charge pump 6, typically approximately 100 ps; and
$\tau_{COMP}$ is the delay introduced by each of the comparators 104, 106 (assumed as being the same as one another) for carrying out the respective comparison operation.

An embodiment may enable a fast calibration of an oscillator to be obtained so as to minimize the final testing time. The difference in frequency (or period) between the reference signal and the oscillating signal is converted into the output signals $S_{OUT\_UP}$ and $S_{OUT\_DW}$ in a time that is approximately equal to or shorter than the longer between the periods of the reference signal and the oscillating signal.

Embodiments may be modified and have various forms. For instance, the high logic value "1" and low logic value "0" may be swapped, and the circuits illustrated in FIGS. 8 and 9 modified accordingly. Moreover, there may be envisaged, wherever expedient, elements (e.g., amplifiers) designed to adapt the logic levels "1" and "0" of one or more signals described previously to the range of voltages accepted at input by the functional element or block that receives them. In this way, the effective voltage values associated to the logic levels "1" and "0" may not be the same for different portions of the calibration circuit in an embodiment.

Moreover, the steps described with reference to FIGS. 2A-2F, 3A-3F, 4A-4F, 5A-5F (generation of the signals at output from the phase-generator block 2), and 6A-6D, 7A-7D (generation of the signals at output from the phase-detector block 4) may be implemented by circuits different from the ones illustrated in FIGS. 8 and 9. For instance, it is possible to implement said steps and other steps by means of a microprocessor, controlled by appropriate software (such as software stored in a memory M and executed by a processor P (see FIG. 11).

Moreover, the step of interpretation of the output signals $S_{OUT\_UP}$ and $S_{OUT\_DW}$, for detecting a ratio between the frequencies of the reference signal $S_{REF}$ and the oscillating signal $S_{OSC}$, may be implemented by a circuit different from the one shown, and for example, by means of a microprocessor, controlled by appropriate software.

Moreover, an embodiment may be implemented in any system or application to facilitate a fast frequency comparison between two periodic signals. For instance, an embodiment may find application in coarse calibration of a frequency synthesizer, for counterbalancing the effects of frequency drift due to process variations and environmental interactions. According to an embodiment, a calibration circuit and method described may be used to speed up the settling time of a frequency synthesizer, or the phase-locking time of a PLL.

Some embodiments may take the form of or include computer program products. For example, according to one embodiment there is provided a computer readable medium including a computer program adapted to perform one or more of the methods or functions described above. The medium may be a physical storage medium such as for example a Read Only Memory (ROM) chip, or a disk such as a Digital Versatile Disk (DVD-ROM), Compact Disk (CD-ROM), a hard disk, a memory, a network, or a portable media article to be read by an appropriate drive or via an appropriate connection, including as encoded in one or more barcodes or other related codes stored on one or more such computer-readable mediums and being readable by an appropriate reader device.

Furthermore, in some embodiments, some of the systems and/or modules and/or circuits and/or blocks may be implemented or provided in other manners, such as at least partially in firmware and/or hardware, including, but not limited to, one or more application-specific integrated circuits (ASICs), digital signal processors, discrete circuitry, logic gates, standard integrated circuits, controllers (e.g., by executing appropriate instructions, and including microcontrollers and/or embedded controllers), field-programmable gate arrays (FPGAs), complex programmable logic devices (CPLDs), etc., as well as devices that employ RFID technology, and various combinations thereof.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
    signal conditioning circuitry configured to receive an oscillating binary signal and a reference binary signal and to output an intermediate oscillating binary signal, an intermediate reference binary signal and a control signal indicative of a stable condition of at least one of the binary signals; and
    a converter circuit coupled to the signal conditioning circuitry and configured to:
        detect transition edges of the intermediate oscillating binary signal and the intermediate reference binary signal; and
        generate first and second control signals indicative of time intervals between edge transitions based on detected edge transitions and the control signal indicative of the stable condition of the at least one of the binary signals, wherein the signal conditioning circuitry is configured to:
    detect a logic value of the oscillating binary signal and a logic value of the reference binary signal;
    if the detected logic value of the oscillating binary signal is equal to the detected logic value of the reference binary signal, generate the intermediate oscillating binary signal based on the oscillating binary signal and generate the intermediate reference binary signal based on the reference binary signal; and
    if the detected logic value of the oscillating binary signal is not equal to the detected logic value of the reference binary signal, generate the intermediate oscillating binary signal based on an inverted oscillating binary signal and generate the intermediate reference binary signal based on the reference binary signal.

2. The device of claim 1 wherein the received oscillating binary signal is generated by a digitally controlled oscillator.

3. The device of claim 1 wherein the control signal indicative of the stable condition of at least one of the binary signals indicates whether the reference binary signal has a stable high logic value or a stable low logic value.

4. The device of claim 1 wherein the converter circuit is configured to generate the first control signal indicative of time intervals by generating a signal having a duration indicative of a time interval.

5. The device of claim 1 wherein the signal conditioning circuitry is configured to determine whether the oscillating binary signal and the reference binary signal are stable for a threshold period of time before generating the control signal indicative of the stable condition of the at least one of the binary signals.

6. The device of claim 1, comprising:
    a charge pump, coupled to the converter circuit and configured to receive the first and second control signals indicative of time intervals; and
    an electric-charge-accumulation element, coupled to the charge pump, wherein the charge pump is configured to charge the electric-charge-accumulation element based on the first control signal indicative of time intervals and to discharge the electric-charge-accumulation element based on the second control signal indicative of time intervals.

7. The device of claim 6, comprising a first comparator coupled to the converter circuit and configured to compare a voltage value on the electric-charge-accumulation element to a first reference value and generate a first comparison signal indicating a result of said comparison of the voltage value on the electric-charge-accumulation element to the first reference value.

8. The device of claim 7, comprising a second comparator coupled to the converter circuit and configured to compare the voltage value on the electric-charge-accumulation element to a second reference value and generate a second comparison signal indicating a result of said comparison of the voltage value on the electric-charge-accumulation element to the second reference value.

9. The device of claim 8, comprising control logic coupled to the first and second comparators and configured to generate at least one signal to control a digitally controlled oscillator (DCO) generating the oscillating binary signal, wherein the control logic is configured to:
    generate the at least one signal to control the DCO to increase a period of the oscillating binary signal if the first and second comparison signals indicate a period of the reference binary signal is longer than a period of the oscillating signal; and
    generate the at least one signal to control the DCO to decrease the period of the oscillating binary signal if the first and second comparison signals indicate the period of the reference binary signal is shorter that the period of the oscillating binary signal.

10. The device according to claim 9 wherein the control logic is configured to:
    generate the at least one signal to control the DCO to increase the period of the oscillating binary signal when the second comparison signal indicates the voltage value on the electric-charge-accumulation element is higher than the second reference value;
    generate the at least one signal to control the DCO to decrease the period of the oscillating binary signal when the first comparison signal indicates the voltage value on the electric-charge-accumulation element is lower than the first reference value; and
    generate an indication that the period of the oscillating binary signal and the period of the reference binary signal are approximately equal when the first and second comparison signals indicate the voltage value on the electric-charge-accumulation element is between the first and second reference values.

11. A device, comprising:
    signal conditioning circuitry configured to receive an oscillating binary signal and a reference binary signal and to output an intermediate oscillating binary signal, an intermediate reference binary signal and a control signal indicative of a stable condition of at least one of the binary signals, wherein the control signal indicative of the stable condition of at least one of the binary signals indicates whether the reference binary signal has a stable high logic value or a stable low logic value; and a converter circuit coupled to the signal conditioning circuitry and configured to:
  detect transition edges of the intermediate oscillating binary signal and the intermediate reference binary signal;
  generate first and second control signals indicative of time intervals between edge transitions based on detected edge transitions and the control signal indicative of the stable condition of the at least one of the binary signals;
  detect a first falling edge transition, from a high logic value to a low logic value, of one between the intermediate reference binary signal and the intermediate oscillating binary signal;
  detect a second falling edge transition, from the high logic value to the low logic value, of the other between the intermediate reference binary signal and the intermediate oscillating binary signal, subsequent in time to the first falling edge transition;
  detect a first rising edge transition, from the low logic value to the high logic value, of one between the intermediate reference binary signal and the intermediate oscillating binary signal; and
  detect a second rising edge transition, from the low logic value to the high logic value, of the other between the intermediate reference binary signal and the intermediate oscillating binary signal, subsequent in time to the first rising edge transition, wherein
    if the control signal indicative of the condition indicates the reference binary signal has a stable high logic value, the converter circuit is configured to:
      generate the first control signal indicative of time intervals based on a time interval elapsing between the first and second falling edge transitions if the first falling edge transition is of the intermediate reference binary signal;
      generate the first control signal indicative of time intervals based on a time interval elapsing between the first and second rising edge transitions if the first rising edge transition is of the intermediate oscillating binary signal;
      generate the second control signal indicative of time intervals based on a time interval elapsing between the first and second falling edge transitions if the first falling edge transition is of the intermediate oscillating binary signal; and
      generate the second control signal indicative of time intervals based on a time interval elapsing between the first and second rising edge transitions if the first rising edge transition is of the intermediate reference binary signal; and
    if the control signal indicative of the condition indicates the reference binary signal has a stable low logic value, the converter circuit is configured to:
      generate the first control signal indicative of time intervals based on a time interval elapsing between the first and second falling edge transitions if the first falling edge transition is of the intermediate oscillating binary signal;
      generate the first control signal indicative of time intervals based on a time interval elapsing between the first and second rising edge transitions if the first rising edge transition is of the intermediate reference binary signal;
      generate the second control signal indicative of time intervals based on a time interval elapsing between the first and second falling edge transitions if the first falling edge transition is of the intermediate reference binary signal; and
      generate the second control signal indicative of time intervals based on a time interval elapsing between the first and second rising edge transitions if the first rising edge transition is of the intermediate oscillating signal.

12. A device, comprising:
signal conditioning circuitry configured to receive an oscillating binary signal and a reference binary signal and to output an intermediate oscillating binary signal, an intermediate reference binary signal and a control signal indicative of a stable condition of at least one of the binary signals; and
a converter circuit coupled to the signal conditioning circuitry and configured to:
  detect transition edges of the intermediate oscillating binary signal and the intermediate reference binary signal; and
  generate first and second control signals indicative of time intervals between edge transitions based on detected edge transitions and the control signal indicative of the stable condition of the at least one of the binary signals, wherein the signal conditioning circuitry is configured to:
determine whether the oscillating binary signal and the reference binary signal are stable for a threshold period of time before generating the control signal indicative of the stable condition of the at least one of the binary signals; and
generate a reset signal to inhibit operation of the converter circuit based on the determination of whether the oscillating binary signal and the reference binary signal are stable for the threshold period of time.

13. The device of claim 12 wherein the signal conditioning circuitry is configured to:
  detect a logic value of the oscillating binary signal and a logic value of the reference binary signal;
  if the detected logic value of the oscillating binary signal is equal to the detected logic value of the reference binary signal, generate the intermediate oscillating binary signal based on the oscillating binary signal and generate the intermediate reference binary signal based on the reference binary signal; and
  if the detected logic value of the oscillating binary signal is not equal to the detected logic value of the reference binary signal, generate the intermediate oscillating binary signal based on an inverted oscillating binary signal and generate the intermediate reference binary signal based on the reference binary signal.

14. The device of claim 12 wherein the converter circuit is configured to generate an end-of-operation signal to indicate generation of the first and second control signals indicative of time intervals is complete.

15. A device, comprising:
signal conditioning circuitry configured to receive an oscillating binary signal and a reference binary signal and to output an intermediate oscillating binary signal, an intermediate reference binary signal and a control signal indicative of a stable condition of at least one of the binary signals; and
a converter circuit coupled to the signal conditioning circuitry and configured to:

detect transition edges of the intermediate oscillating binary signal and the intermediate reference binary signal;

generate first and second control signals indicative of time intervals between edge transitions based on detected edge transitions and the control signal indicative of the stable condition of the at least one of the binary signals; and generate an end-of-operation signal to indicate generation of the first and second control signals indicative of time intervals is complete.

16. The device of claim 15 wherein the signal conditioning circuitry is configured to:

detect a logic value of the oscillating binary signal and a logic value of the reference binary signal;

if the detected logic value of the oscillating binary signal is equal to the detected logic value of the reference binary signal, generate the intermediate oscillating binary signal based on the oscillating binary signal and generate the intermediate reference binary signal based on the reference binary signal; and if the detected logic value of the oscillating binary signal is not equal to the detected logic value of the reference binary signal, generate the intermediate oscillating binary signal based on an inverted oscillating binary signal and generate the intermediate reference binary signal based on the reference binary signal.

17. A method, comprising:

receiving an oscillating binary signal and a reference binary signal;

outputting an intermediate oscillating binary signal, an intermediate reference binary signal and a control signal indicative of a stable condition of at least one of the binary signals;

detecting transition edges of the intermediate oscillating binary signal and the intermediate reference binary signal; and generating first and second control signals indicative of time intervals between edge transitions based on detected edge transitions and the control signal indicative of the stable condition of the at least one of the binary signals, wherein the outputting the intermediate oscillating binary signal and the intermediate reference binary signal comprises:

detecting a logic value of the oscillating binary signal and a logic value of the reference binary signal;

if the detected logic value of the oscillating binary signal is equal to the detected logic value of the reference binary signal, generating the intermediate oscillating binary signal based on the oscillating binary signal and generating the intermediate reference binary signal based on the reference binary signal; and if the detected logic value of the oscillating binary signal is not equal to the detected logic value of the reference binary signal, generating the intermediate oscillating binary signal based on an inverted oscillating binary signal and generating the intermediate reference binary signal based on the reference binary signal.

18. The method of claim 17, comprising controlling a digitally controlled oscillator (DCO) configured to generate the received oscillating binary signal based on the first and second control signals indicative of time intervals.

19. The method of claim 18, comprising:

controlling the DCO to increase a period of the oscillating binary signal when the first and second signals indicative of time intervals indicate the period of the oscillating binary signal is less than a period of the reference binary signal; and controlling the DCO to decrease the period of the oscillating binary signal when the first and second signals indicative of time intervals indicate the period of the oscillating binary signal is greater than the period of the reference binary signal.

20. The method of claim 17 wherein the control signal indicative of the stable condition of at least one of the binary signals indicates whether the reference binary signal has a stable high logic value or a stable low logic value.

21. The method of claim 20, comprising:

detecting a first falling edge transition, from a high logic value to a low logic value, of one between the intermediate reference binary signal and the intermediate oscillating binary signal;

detecting a second falling edge transition, from the high logic value to the low logic value, of the other between the intermediate reference binary signal and the intermediate oscillating binary signal, subsequent in time to the first falling edge transition;

detecting a first rising edge transition, from the low logic value to the high logic value, of one between the intermediate reference binary signal and the intermediate oscillating binary signal; and detecting a second rising edge transition, from the low logic value to the high logic value, of the other between the intermediate reference binary signal and the intermediate oscillating binary signal, subsequent in time to the first rising edge transition, wherein, when the control signal indicative of the condition indicates the reference binary signal has a stable high logic value, generating the first and second control signals indicative of time intervals includes:

generating the first control signal indicative of time intervals based on a time interval elapsing between the first and second falling edge transitions if the first falling edge transition is of the intermediate reference binary signal;

generating the first control signal indicative of time intervals based on a time interval elapsing between the first and second rising edge transitions if the first rising edge transition is of the intermediate oscillating binary signal;

generating the second control signal indicative of time intervals based on a time interval elapsing between the first and second falling edge transitions if the first falling edge transition is of the intermediate oscillating binary signal; and generate the second control signal indicative of time intervals based on a time interval elapsing between the first and second rising edge transitions if the first rising edge transition is of the intermediate reference binary signal; and when the control signal indicative of the condition indicates the reference binary signal has a stable low logic value, generating the first and second control signals indicative of time intervals includes:

generating the first control signal indicative of time intervals based on a time interval elapsing between the first and second falling edge transitions if the first falling edge transition is of the intermediate oscillating binary signal;

generating the first control signal indicative of time intervals based on a time interval elapsing between the first and second rising edge transitions if the first rising edge transition is of the intermediate reference binary signal;

generating the second control signal indicative of time intervals based on a time interval elapsing between the first and second falling edge transitions if the first falling edge transition is of the intermediate reference binary signal; and generating the second control signal indicative of time intervals based on a time interval elapsing between the first and second rising edge transitions if the first rising edge transition is of the intermediate oscillating signal.

22. The method of claim 17, comprising determining whether the oscillating binary signal and the reference binary signal are stable for a threshold period of time before generating the control signal indicative of the stable condition of the at least one of the binary signals.

23. The method of claim 17, comprising:
charging an electric-charge-accumulation element based on the first control signal indicative of time intervals and discharging the electric-charge-accumulation element based on the second control signal indicative of time intervals.

24. A system, comprising:
a digitally controlled oscillator (DCO) configured to generate an oscillating binary signal;
signal conditioning circuitry coupled to the DCO and configured to receive the oscillating binary signal and a reference binary signal and to output an intermediate oscillating binary signal, an intermediate reference binary signal and a control signal indicative of a stable condition of at least one of the binary signals; and
a converter circuit coupled to the signal conditioning circuitry and configured to:
  detect transition edges of the intermediate oscillating binary signal and the intermediate reference binary signal;
  generate first and second control signals indicative of time intervals between edge transitions based on detected edge transitions and the control signal indicative of the stable condition of the at least one of the binary signals, wherein the signal conditioning circuitry is configured to:
detect a logic value of the oscillating binary signal and a logic value of the reference binary signal;
if the detected logic value of the oscillating binary signal is equal to the detected logic value of the reference binary signal, generate the intermediate oscillating binary signal based on the oscillating binary signal and generate the intermediate reference binary signal based on the reference binary signal; and
if the detected logic value of the oscillating binary signal is not equal to the detected logic value of the reference binary signal, generate the intermediate oscillating binary signal based on an inverted oscillating binary signal and generate the intermediate reference binary signal based on the reference binary signal.

25. The system of claim 24 wherein the control signal indicative of the stable condition of at least one of the binary signals indicates whether the reference binary signal has a stable high logic value or a stable low logic value.

* * * * *